(12) United States Patent
Deligianni et al.

(10) Patent No.: US 8,637,849 B2
(45) Date of Patent: Jan. 28, 2014

(54) VERTICAL NANOWIRE FET DEVICES

(75) Inventors: Hariklia Deligianni, Tenafly, NJ (US);
Qiang Huang, Ossining, NY (US);
Lubomyr T. Romankiw, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 514 days.

(21) Appl. No.: 12/984,653

(22) Filed: Jan. 5, 2011

(65) Prior Publication Data
US 2011/0108803 A1 May 12, 2011

Related U.S. Application Data

(62) Division of application No. 11/860,459, filed on Sep. 27, 2007, now Pat. No. 7,892,956.

(51) Int. Cl.
*H01L 29/06* (2006.01)

(52) U.S. Cl.
USPC .................................... 257/24; 257/E29.245

(58) Field of Classification Search
USPC .................... 257/24, 220, 302, 329, E29.245; 977/762, 938
See application file for complete search history.

(56) References Cited

U.S. PATENT DOCUMENTS

| | | | |
|---|---|---|---|
| 2,690,422 A | 9/1954 | Szekeley | |
| 5,320,736 A | 6/1994 | Stickney et al. | |
| 5,581,091 A | 12/1996 | Moskovits | |
| 5,612,563 A | 3/1997 | Fitch | |
| 6,838,297 B2 | 1/2005 | Iwasaki | |
| 6,843,902 B1 | 1/2005 | Penner | |
| 6,911,373 B2 | 6/2005 | Kellar | |
| 7,230,286 B2 | 6/2007 | Cohen et al. | |
| 2003/0047749 A1* | 3/2003 | Chaudhry et al. | 257/135 |
| 2004/0005258 A1 | 1/2004 | Fonash | |
| 2004/0238367 A1 | 12/2004 | Penner et al. | |
| 2005/0110145 A1 | 5/2005 | Elers | |
| 2005/0167655 A1 | 8/2005 | Furukawa | |
| 2005/0167740 A1 | 8/2005 | Furukawa et al. | |
| 2005/0172370 A1 | 8/2005 | Haq et al. | |
| 2005/0179029 A1 | 8/2005 | Furukawa et al. | |
| 2006/0011972 A1 | 1/2006 | Graham | |
| 2006/0128088 A1 | 6/2006 | Graham et al. | |

(Continued)

OTHER PUBLICATIONS

H. T. Ng et al, "Single Crystal Nanowire Vertical Surround-Gate Field-Effect Transistor Nanotechnology Letters", vol. 4, pp. 1247-1252 (2004).

(Continued)

*Primary Examiner* — Kimberly Rizkallah
*Assistant Examiner* — Duy T Nguyen
(74) *Attorney, Agent, or Firm* — Louis J. Percello; Ryan, Mason & Lewis, LLP

(57) ABSTRACT

A Vertical Field Effect Transistor (VFET) formed on a substrate, with a conductive bottom electrode formed thereon. A bottom dielectric spacer layer and a gate dielectric layer surrounded by a gate electrode are formed thereabove. Thereabove is an upper spacer layer. A pore extends therethrough between the electrodes. A columnar Vertical Semiconductor Nanowire (VSN) fills the pore and between the top and bottom electrodes. An FET channel is formed in a central region of the VSN between doped source and drain regions at opposite ends of the VSN. The gate dielectric structure, that is formed on an exterior surface of the VSN above the bottom dielectric spacer layer, separates the VSN from the gate electrode.

20 Claims, 21 Drawing Sheets

(56) References Cited

U.S. PATENT DOCUMENTS

2006/0249726 A1 11/2006 Choi et al.
2006/0273389 A1 12/2006 Cohen et al.
2007/0199826 A1 8/2007 Son et al.

OTHER PUBLICATIONS

J. Goldberger et al, "Silicon Vertically Integrated Nanowire Field Effect Transistors", American Chemical Society, Nano Letters, vol. 6, pp. 973-977 (2006).
J. Chen et al, "Vertical nanowire transistor in flexible polymer foil", Applied Physics Letters, vol. 82, pp. 4782-4784 (2003).
J. Chen et al, "Vertical nanowire transistors with low leakage current", Applied Physics Letters, vol. 85, pp. 1401-1403 (2004).
Heydon et al., "Magnetic Properties of Electrodeposited Nanowires" J. Phys. D: Appl. Phys. vol. 30, pp. 1083-1093 (1997).
Zhang et al. "Fabrication of Highly Ordered InSb Nanowire Arrays by Electrodeposition in Porous Anodic Membranes", Journal of the Electrochemical Society 152 (10), pp. C664-C668 (2005).
Martin, "Nanomaterials: A Membrane-Based Synthetic Approach" Science Vol . 266, No. 5193, pp. 1961-1966 (1994).
P. Nguyen et al, "Direct Integration of Metal Oxide Nanowire in Field-Effect Nanotransistor", American Chemical Society, Nano Letters 4 (4), pp. 651-657 (2004).
T. Bryllert, "Vertical wrap-gated nanowire transistors", Nanotechnology, vol. 17, p. S227-S230 (2006).
T. Bryllert, "Vertical High-Mobility Wrap-Gated InAs Nanowire Transistor", IEEE Electron Device Letter, vol. 27, pp. 323-335 (2006).
V. Schmidt et al, "Realization of a Silicon Nanowire Vertical Surround-Gate Field-Effect Transistor", Small, vol. 2, pp. 85-88 (2006).
Whitney et al., "Fabrication and Magnetic Properties of Arrays of Metallic Nanowires", Science, vol. 261, No. 5126, pp. 1316-1319 (1993).

\* cited by examiner

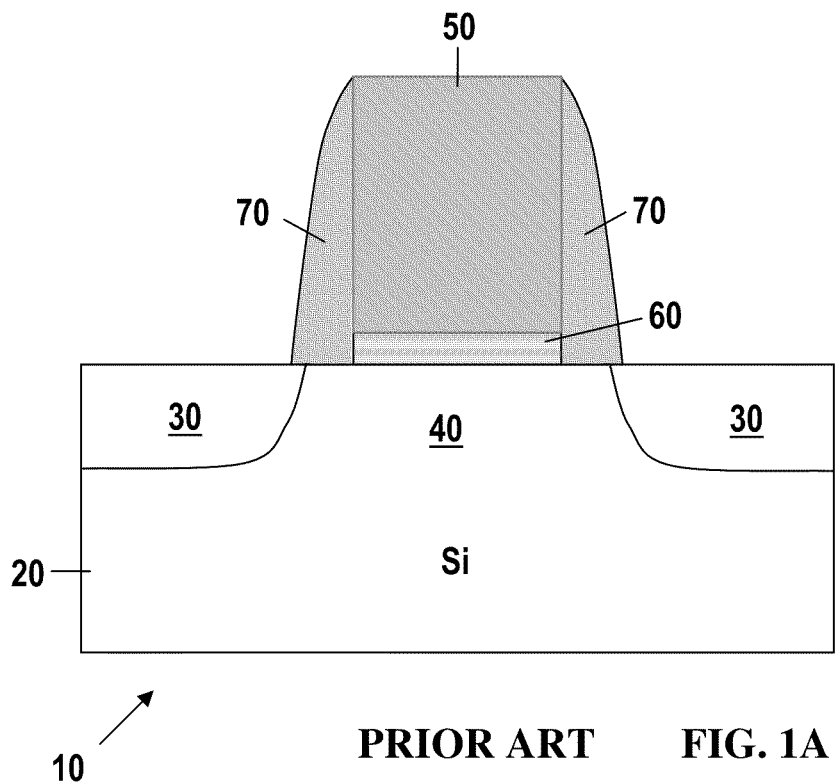
PRIOR ART  FIG. 1A
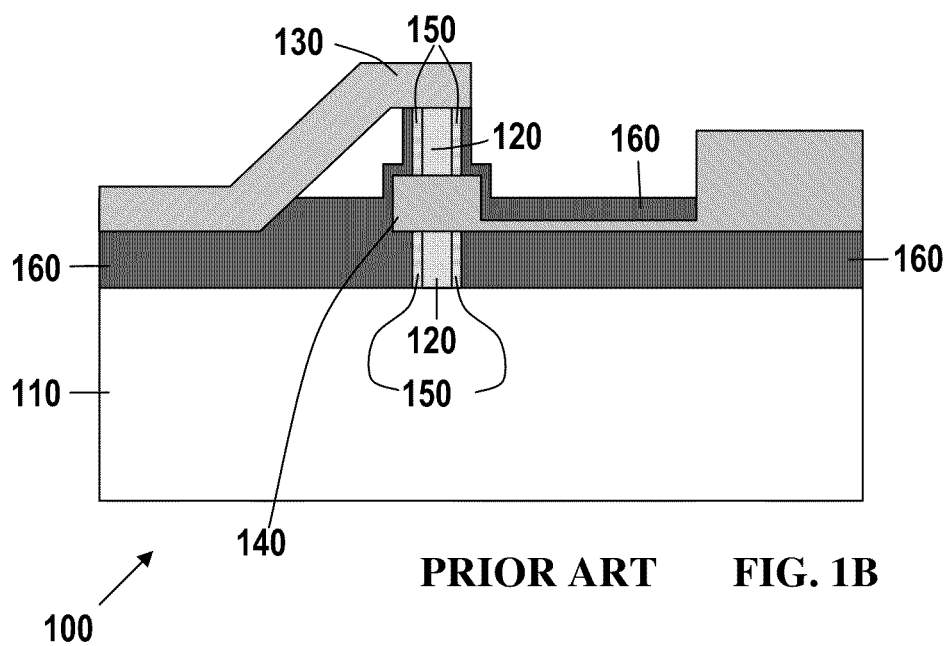
PRIOR ART  FIG. 1B

VERTICAL NANOWIRE FET DEVICES

This is a divisional application of U.S. patent application Ser. No. 11/860,459 filed 27 Sep. 2007, of H. Deligianni et al. now U.S. Pat. No. 7,892,956 entitled "Methods of Manufacture of Vertical Nanowire FET Devices."

CROSS-REFERENCE TO RELATED APPLICATIONS

The present application is related to U.S. Pat. No. 7,785,982 based on copending U.S. patent application Ser. No. 11/620,224 filed 5 Jan. 2007, of S.W. Bedell et al. entitled "Structures Containing Electrodeposited Germanium and Methods for Their Fabrication." This application is also related to U.S. Pat. No. 7,659,200 based on copending U.S. patent application Ser. No. 11/620,391 filed 5 Jan. 2007 of H. Deligianni et al. entitled "Self-Constrained Anisotropic Germanium Nanostructure from Electroplating," which were assigned to International Business Machines Corporation, the assignee of the present application. The contents of the above two patent applications are incorporated herein by reference for all purposes.

BACKGROUND OF THE INVENTION

The present invention relates to Field Effect Transistor (FET) devices formed of semiconductor nanowires and to a method to fabrication thereof. More particularly, the present invention relates to vertical FET devices with electroplated semiconductor nanowires integrated into three dimensional devices and methods of manufacture thereof.

Improvements in semiconductor FETs have traditionally been implemented by scaling down the relative device dimensions. However, because of fundamental scaling limits, advanced FETs rely increasingly on nontraditional materials and structures and special integration schemes to achieve desired improvements in circuit performance. High-mobility channel FETs in which the channel material comprises a high-mobility material such as germanium instead of silicon (as is traditional) are an example of a type of FET incorporating nontraditional materials. Nanowire based FETs in which a semiconductor nanowire is used as the device channel are known to exhibit quantum confinement effect and an improved device performance. Furthermore, the integration of vertical FETs in a three dimensional fashion has been another nontraditional method to improve the device performance at the system level.

Inorganic semiconductor nanowires can be readily grown by a Chemical Vapor Deposition (CVD) process. Individual inorganic nanowire based FETs have been studied previously. Such transistors are generally fabricated by growing a forest of wires, collecting wires in a liquid suspension, randomly distributing the wires on a substrate, and making contacts to the individual wires to form horizontal devices. Recently, vertical nanowire based field-transistor devices are fabricated in which nanowires of inorganic semiconductors such as Si, ZnO, $In_2O_3$ and InAs are grown by CVD processes (see V. Schmidt et al, Small, vol. 2, p. 85 (2006); J. Goldberger et al, Nano Letters, vol. 6, p. 973 (2006); T. Bryllert, Nanotechnology, vol. 17, p. S227 (2006); T. Bryllert, IEEE Electron Device Letter, vol. 27, p. 323 (2006); H. T. Ng et al, "Single Crystal Nanowire Vertical Surround-Gate Field-Effect Transistor" Nanotechnology Letters, vol. 4, pp 1247-1252 (2004); and P. Nguyen et al, "Direct Integration of Metal Oxide Nanowire in Field-Effect Nanotransistor", American Chemical Society, Nano Letters, vol. 4, (4) pp 651-657 (2004). The CVD growth of the nanowires starts from a catalytic particle. Therefore in principle, the vertical devices such fabricated can be precisely placed at desired locations and the diameter of the nanowires can be controlled by controlling the location and size of the catalytic particles. However, the catalytic particles are in most cases present in a liquid form at the temperature of nanowire growth and agglomerate. The performance of the devices becomes hard to control as a result of the variation in the nanowire diameter.

Electroplated wide band-gap compound semiconductor, CuSCN, formed in a polymer membrane are described in J. Chen et al, "Vertical nanowire transistors with low leakage current", Applied Physics Letter, vol. 82, p. 4782 (2003); and vol. 85, p. 1401-1403 (2004). The devices described therein generally suffer from the poor controllability of the processes. A FET fabricated using the process in the prior-art has limited options for the channel geometry, the properties of the dielectrics, the properties of the gate electrode material and the properties of the source and drain electrodes.

A polymer template having randomly located pores was described in a paper by Heydon et al., entitled "Magnetic Properties of Electrodeposited Nanowires" J. Phys. D: Appl. Phys. Vol. 30, No. 7, pp 1083-1093 (1997), and the semiconductor nanowire devices formed were also randomly distributed and the integration of the devices was impossible. In addition, the wide band-gap compound semiconductor, CuSCN, limited the variation and applications of the devices. See also an article by Martin, entitled "Nanomaterials: A Membrane-Based Synthetic Approach" Science Vol. 266, No. 5193, pp. 1961-1966 (1994); and an article by Whitney et al., entitled "Fabrication and Magnetic Properties of Arrays of Metallic Nanowires", Science Vol 261, No. 5126, pp. 1316-1319 (1993).

Methods of forming germanium epitaxial structures, including germanium nanowires by electroplating are described in a copending U.S. patent application Ser. No. 11/620,224 of S. W. Bedell et al entitled "Structures Containing Electrodeposited Germanium and Methods for Their Fabrication" filed 5 Jan. 2007, and a copending U.S. patent application Ser. No. 11/620,391 of H. Deligianni et al. "Self-Constrained Anisotropic Germanium Nanostructure from Electroplating" also filed 5 Jan. 2007, which are commonly assigned to the assignee of the present application.

U.S. Pat. No. 6,838,297 of Iwasaki et al. entitled "Nanostructure, Electron Emitting Device, Carbon Nanotube Device, and Method of Producing the Same" describes a nanostructure including an anodized film with nanoholes cut completely through the anodized film from the surface of the anodized film to the surface of the substrate. The anodized film is formed on a substrate having a surface including a material including semiconductors, noble metals, Mn, Fe, Co, Ni, Cu and carbon. The nanoholes have variable diameters such as a constriction at a location between the surface of the anodized film and the surface of the substrate. After producing the nanoholes on the n-type silicon substrate and performing the pore widening process in a similar manner to the second embodiment, Co was electro-deposited thereby forming catalytic fine particles inside the nanoholes. Subsequently, the sample was heated at 700° C. for 1 hour in a mixed gas of 2% $C_2H_4$ and 98% He so that carbon nanotubes were grown from the catalytic ultra-fine particles. Carbon nanotubes, which bristle outwardly at different angles from the inside of the nanoholes had diameters of the carbon ranging from 2 nm to 50 nm and they were tilted at different angles and had very substantially smaller diameters than the nanoholes.

FIG. 1A is a schematic diagram of a prior art horizontal FET 10 formed on a semiconductor substrate 20 composed of a material such as silicon, germanium and gallium arsenate. The substrate 20 is properly doped according to the type of the devices, e.g., n-FET or p-FET. There are source and drain electrodes 30 located at both ends of the FET 10. The very top region of the substrate 20 between the source and drain electrodes 30 is the channel 40 of the FET 10. The on-off state of the FET 10 is controlled by a gate electrode 50 located above the channel region 40. A gate dielectric layer 60 is present between the channel 40 and the gate electrode 50. The sidewall of gate electrode is separated from other parts of the device by a spacer layer 70.

FIG. 1B is a schematic diagram of a prior art vertical FET 100 built from a semiconductor nanowire grown by a CVD process as described in T. Bryllert et al., entitled "Vertical High-Mobility Wrap-Gated InAs Nanowire Transistor", IEEE Electron Device Letters, 27(5), pp 323-325 (2006.) The transistor 100 includes a channel 120 comprising a semiconductor nanowire grown by CVD processing on a substrate 110 which also serves as the source electrode. After the growth of the semiconductor nanowire 120, a gate dielectric layer 150 is deposited around the semiconductor nanowire 120. Then at a middle portion of the semiconductor nanowire 120, a gate electrode 140 is fabricated wrapped about the gate dielectric 150 and the semiconductor nanowire 120 within the gate dielectric 150. A drain electrode 130 is fabricated with a special process so that it covers the top part of the semiconductor nanowire 120. The gate electrode 140 is separated from the source electrode 110 and the drain electrode 130 by spacer layers 160 which are deposited on the surface of the substrate 110 and surrounding the gate electrode 140. A contact line 130 is connected to the top of the semiconductor nanowire 120. The gate is supported by the gate dielectric layer 150 and the spacer layers 160.

The semiconductor nanowires of Bryllert et al. which are formed on a chip are fabricated by using metal particles as seeds for anisotropic epitaxial growth of semiconductor nanowires using a Chemical Vapor Deposition (CVD) system. The device fabrication is performed on the semiconductor nanowire afterwards. The metal gate is formed by first depositing SiNx as gate dielectric on the wires. Then the gate metal is deposited using sputtering covering the whole wires with SiNx and gate metal. In order for the gate wrapping to be present only around the base of the wires, the chip is spin coated with an organic film. The film is then etched back to expose the tops of the wires. The gate metal is etched away from the top of the wires. A gate pad and the gate finger are defined by optical lithography and wet etching. A drain contact which wraps around the top of the wires, is fabricated with an airbridge technology. The source contact is provided by an InAs substrate. The fabrication process continues with wires with wrap gates formed thereon.

U.S. Pat. No. 7,230,286 of Cohen et al. entitled "Vertical FET with nanowire channels and a silicided bottom contact" which is commonly assigned describes a vertical FET structure with nanowires forming FET channels on a bottom, epitaxial, conductive silicide layer which is epitaxial and conductive. The nanowires are grown perpendicular to the bottom conductive layer. A source and a drain are located at each end of the semiconductor nanowires with a channel therebetween. A gate dielectric surrounds the channel of each semiconductor nanowire and a gate conductor surrounds the gate dielectric. Top and bottom insulator plugs function as gate spacers and reduce the gate-source and gate-drain capacitance. Catalyst dots such as Au, Ga, Al, Ti, and Ni for the nanowire growth are formed over the exposed silicide layer. The widths of the catalyst dots define the nanowire diameters. The growth of the nanowires, which is assisted by the catalyst dots and is typically carried out by CVD or Plasma Enhanced Chemical Vapor Deposition (PECVD) using silane or silicon tetrachloride. Note that the nanowires can be comprised of the same or different material from that of the semiconductor substrate.

In one embodiment, it is preferred that the nanowires should be comprised of a material that is different from the semiconductor substrate. In yet another embodiment of the invention, the nanowires are single-crystal Si nanowires having substantially the same crystal orientation. Si nanowires can be formed on a (111) oriented Si substrate, the silicon nanowires orientation is (111) as it is seeded from the substrate which also has the (111) orientation. Thus a silicide film which mimics the substrate orientation is used. While the Cohen patent teaches vertical FETs made from nanowires, they are not formed in nanopores which control the configuration of the nanowires and the nanowires are not in contact with the lower dielectric layer containing the nanopores. The FETs therein comprise multiple nanowires and therefore they comprise multiple device channels.

In the prior art shown in FIG. 1B, the semiconductor nanowires, which were grown by CVD process, were free standing and fragile after growth thereof. The Cohen et al. semiconductor nanowires which were grown by CVD or PECVD are also freestanding grown without any support and accordingly they are also fragile. Therefore the processes for fabrication of such free standing nanowires is intrinsically challenging in order to avoid damaging the wires during processing.

SUMMARY OF THE INVENTION

The present invention discloses methods of growing semiconductor nanowires conformal to and embedded in templates and for fabricating FET devices based on the semiconductor nanowires.

An object of this invention is to be able to fabricate vertical FETs composed of electroplated germanium nanowires.

Another object of this invention is to provide a method for integrating a vertical FET into a three-dimensional high density device.

It is still another object of this invention to improve the controllability and flexibility of the method of fabricating electroplated nanowire based FETs.

'It is also desired to improve the method to fabricate electroplated nanowire based FETs using processes that are compatible with the current Complementary Metal Oxide Semiconductor (CMOS) technology.

We have discovered that as an alternative to the CVD method, semiconductor nanowires can be formed by an electroplating method using a predetermined template in which deep columnar pores (nanoholes) are present and are filled with semiconductor materials by electroplating. The semiconductor nanowires so formed are precisely located and have diameters predetermined by the pore diameters.

Furthermore, it is desired to fabricate vertical FETs based on electroplated nanowires composed of mid band-gap or low band-gap semiconductors.

In accordance with one aspect of the present invention a vertically oriented FET device comprises an electroplated vertical semiconductor nanowire forming a channel of the FET device. There are a bottom electrode and a top electrode for a source and a drain for the FET. A gate dielectric material is formed covering a surface of the middle portion of the semiconductor nanowire. A gate electrode, which is formed on the gate dielectric material, is separated from the top and bottom electrodes by dielectric spacer layers.

In accordance with this invention a method is provided for forming a FET (FET) device from the electroplated semiconductor nanowire by the following steps. Deposit a stack of layers on an insulating substrate which includes a bottom conductive layer, a dielectric spacer layer, a gate electrode layer and a dielectric space material. Then create columnar pores comprising nanoholes in the material stack connecting to the bottom conductive layer by etching through the top spacer layer, the gate electrode layer and the bottom spacer layer using a patterned mask. Then create a recessed region on the exposed sidewalls of the gate electrode layer inside the columnar pores. Selectively form a gate dielectric layer in the recessed region. Plate semiconductor nanowires in the columnar pores by either applying a plating current or potential across the conductive layer at the bottom of the stack and a conductive anode in the electrolyte, where the semiconductor materials is formed in the columnar pores to form a wire-shaped structure, or by plating electrolessly. Preferably polish and planarize the top surface of the semiconductor nanowire and the top dielectric spacer layer. Deposit a top conductive layer.

In accordance with another aspect of this invention a method is provided for forming an FET device with electroplated semiconductor nanowires on an insulating substrate by the following steps. Deposit a stack of layers including a bottom conductive layer, a dielectric spacer layer and a thick sacrificial dielectric layer on an insulating substrate. Create column shaping pores in the material stack connecting to the bottom conductive layer by dry etching the sacrificial dielectric material and the spacer layer using a patterned mask. Electroplate semiconductor nanowires in the columnar pores by applying the plating current or potential across the conductive layer at the bottom of the stack and a conductive anode in the electrolyte, where the semiconductor materials is formed in the columnar pores to form a wire-shape structure. Remove the sacrificial dielectric material to expose an upper portion of the semiconductor nanowires. Deposit a gate dielectric layer on a surface of the semiconductor nanowires and on top of the spacer layer by conformal depositing a gate dielectric material. Deposit a gate electrode layer on the spacer layer by directional deposition process. Form a top spacer layer on the gate electrode layer by directional deposition. Polish and planarize the top surface of the semiconductor nanowires and the top dielectric spacer layer. Then deposit a top conductive layer. The top and bottom conductive layers serve as source and drain electrodes.

Another method of forming a FET device from an electroplated semiconductor nanowire includes the following steps. Deposit on an insulating substrate a stack of layers including a conductive layer as source or drain electrode layer, a dielectric spacer layer, an optional gate dielectric material and a gate electrode layer. Create via structures in the gate electrode layer by etching the gate electrode layer using an etching mask. Deposit a gate dielectric material to fill the vias in the gate electrode layer and polish the gate dielectric material. Deposit a second dielectric spacer layer. On top of the second spacer layer, form an etching mask having vias aligned with the vias in the gate electrode layer, wherein the vias in the mask are slightly smaller than the vias in gate electrode layer. Create column shaping pores through the stack of layers using a directional dry etching process with the mask, wherein the column shaping pores expose the conductive layer at the bottom of the stack of layers extending through the top spacer layer, the gate dielectric layer and the bottom spacer layer without touching the gate electrode layer, and wherein the gate dielectric material remaining in the vias of the gate electrode layer is continuous. Electroplate semiconductor nanowires in the columnar pores by applying the plating current or potential across the conductive layer at the bottom of the stack and a conductive anode in the electrolyte, where the semiconductor materials is formed in the column shaping pores to form a wire-shape structure. Polish and planarize the top surface of the semiconductor nanowire and the top dielectric spacer layer. Deposit a top conductive layer as a second source or drain electrode layer.

Another aspect of the present invention relates to a method of forming arrays of separate FETs with electroplated semiconductor nanowires by the following steps. Form vertical oriented FETs from electroplated semiconductor nanowires having common source, gate, and drain electrodes.

Make contacts to the gate electrode, source/drain electrodes by forming columnar pores across the stack of layers on the electrode to be connected and forming interconnect via structures by filling the columnar pores with conductive layers. Then form isolating structures to separate the transistors by patterning on top of the top source/drain electrode, etching through the stacks of materials. Then form isolating structures by filling dielectric material into the etched structures.

In a preferred embodiment of the present invention, the contacts to the electrodes are Cu interconnect structures formed by electroplating Cu into the columnar pores. The contact structures to the bottom source or drain electrode through the gate electrode layer and are isolated from the gate electrode layer by forming an insulating or dielectric structure in between. In a preferred embodiment of the present invention, a recessed region is created on the sidewall inside the columnar pores wherein the gate electrode layer is exposed and a dielectric material is selectively formed in the recessed region.

Another embodiment of the present invention discloses a method of forming three dimensionally integrated FET devices with electroplated semiconductor nanowires by the following steps. Form vertical oriented FETs having electroplated semiconductor nanowires and common source, gate, and drain electrodes. Isolate the FETs and make contacts to individual gate electrode and source/drain electrodes to form separate devices. Then stack the arrays of FET devices on top of each other by repeating forming another level of vertical FETs having electroplated semiconductor nanowires on top of the previous level of transistors.

Still other advantages of the present invention will become readily apparent by those skilled in the art from the following detailed description, wherein it is shown and described in the preferred embodiments, by way of illustration of the best mode. As will be realized, the disclosure is capable of other and different embodiments, and its several details are capable of modifications without departing from the spirit of the disclosure. Accordingly, the description is to be regarded as illustrative in nature and not as restricted thereto.

The invention and objects and features thereof will be more readily apparent from the following detailed description and appended claims when taken with the drawings.

BRIEF DESCRIPTION OF THE DRAWINGS

FIG. 1A is a schematic diagram of a prior art horizontal FET formed on a semiconductor substrate.

FIG. 1B is a schematic diagram of a prior art vertical FET built from a semiconductor nanowire.

The detailed description which follows explains the preferred embodiments of the invention, together with advantages and features with reference to the drawings.

DETAILED DESCRIPTION OF THE INVENTION, AND PREFERRED EMBODIMENTS THEREOF

First Embodiment

FIGS. 2A to 2H are schematic diagrams showing processing steps of a method for fabrication of a vertical Field Effect Transistor (FETS) FETs 200 with electroplated semiconductor nanowires as the device channels according to one embodiment of the present invention.

Figure 2A:
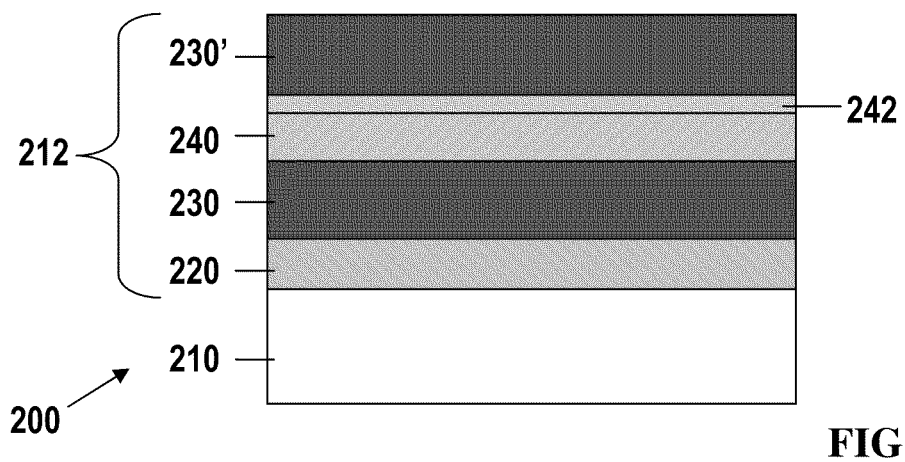
FIG. 2A to 2H are schematic diagrams illustrating a method of fabricating vertical FETs having electroplated semiconductor nanowires and common gate, source and drain electrodes according to one embodiment of the present invention.

FIG. 2A shows a vertical FET 200 in accordance with this invention in an early stage of fabrication thereof consisting of a stack 212 of layers formed on a substrate 210. The stack 212 of layers comprises a conductive layer 220, a spacer layer 230, a gate electrode layer 240, and a second spacer layer 230'. The substrate 210 can be composed of any nonconductive, or highly resistive semiconductor material, including but not limited to aluminum oxide, magnesium oxide, zinc oxide, silicon oxide, silicon nitride, glass, undoped silicon, silicon carbide, and combinations thereof.

The substrate 210 can also comprise a layered structure with a top surface being nonconductive or highly resistive. The conductive layer 220, that is provided to be formed into source or drain electrodes, is composed of any suitable electrode material, including but not limited to silicide, germanite, Pt, Pd, Al, Er, Ti, and any combinations or layered structure of the above.

The bottom spacer layers 230 and the upper spacer layer 230' can be composed of any dielectric or insulating material that can be used for this purpose, including but not limited to silicon oxide, silicon nitride, aluminum oxide, hafnium oxide, and combinations or multilayers of the above.

The gate electrode layer 240 can be composed of any conductive or low resistive semiconductor material that is suitable to be formed into an FET gate electrode, including but not limited to polysilicon, Pd, Pt, Al, Er, Ti, and any combinations of the above. The thickness of the gate electrode layer 240 is determined by the gate length of the device to be built.

The gate electrode layer 240 is shown coated with an optional capping layer 242 provided to protect the gate electrode layer 240 from damage during the process of deposition of the spacer layer 230' thereabove. Materials which are suitable for use in the capping layer 242 include but are not limited to silicon nitride, silicon oxide, aluminum oxide, silicon oxynitride, and other nonconductive materials. The capping layer 242 can be composed of the same materials as the bottom spacer layer 230 and the top spacer layer 230'.

The stack 212 of layers 220, 230, 240, 242, and 230' can be deposited sequentially onto the substrate 210 by sputtering, evaporation, Physical Vapor Deposition (PVD), Chemical Vapor Deposition (CVD), Atomic Layer Deposition (ALD), electron beam epitaxy and any other available deposition processes. The bottom conductive layer 220 can be also formed by a deposition of precursors, such as silicon and metal, and then a reaction to form the conductive layer, such as silicide, from the precursors.

Figure 2B:
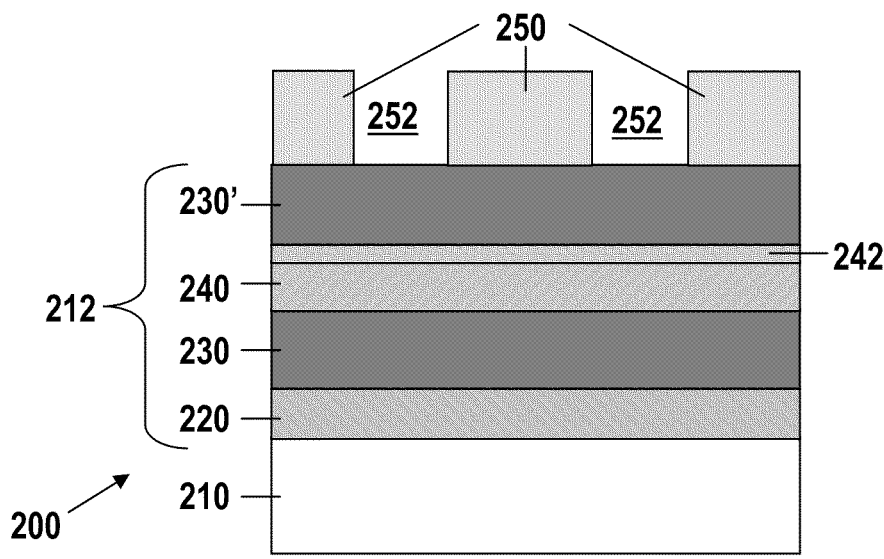

FIG. 2B shows the device 200 of FIG. 2A after formation of a dry etch mask 250 on top of the substrate structure 200. The mask 250 is patterned with via openings 252 which expose the top surface of the spacer layer 230'. The mask 250 can be composed of any material suitable for an etch mask, including but not limited to photoresist, UV resist, antireflective coating materials, polymer materials, aluminum, titanium, and the combination of above.

In one embodiment of the present invention, the mask 250 is a self-assembled diblock copolymer material, where the vias 252 have a diameter from 1 to 30 nm. The mask 250 can also be formed by standard photolithography processes and e-beam lithography, where the vias 252 have a diameter from 1 to 1000 nm and preferably from 1 to 100 nm. The mask 250 can further consist of multilayered materials, which can be formed by multiple processes including photolithography, UV lithography, e-beam lithography, diblock copolymer self-assembly, and dry etch processes.

Figure 2C:
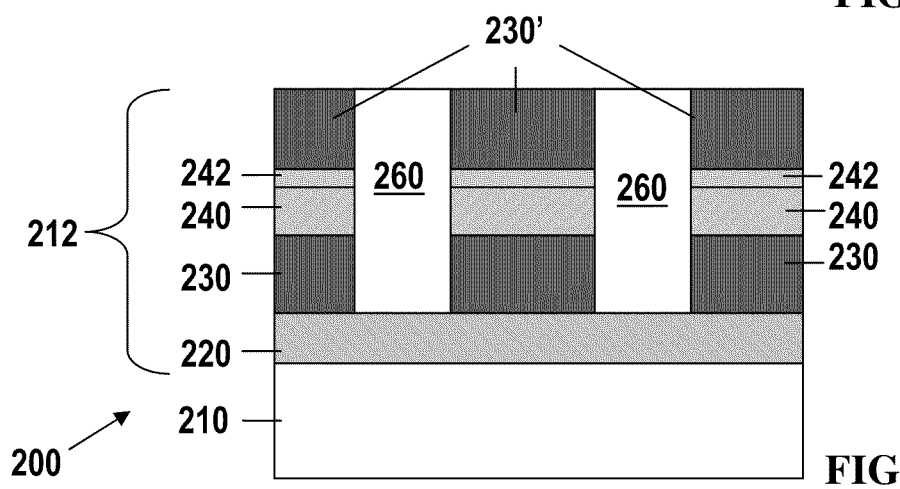

FIG. 2C shows the device 200 of FIG. 2B after etching through the mask 250 to form a set of column shaping pores 260 and after stripping of the mask 250. The column shaping 260 comprise openings which extend down through the layers including the spacer layer 230' and the gate electrode layer 240, the optional capping layer 242, and spacer layer 230 using a dry etching process such as Reactive Ion Etching (RIE) to form columnar pores 260. The column shaping pores 260 extend through most of the layers of stack 212 down to connect with the conductive layer 220. After the completion of the etching step, the mask 250 was removed by a chemical etching process, e.g. dissolving mask 250 in a proper solvent.

Figure 2D:
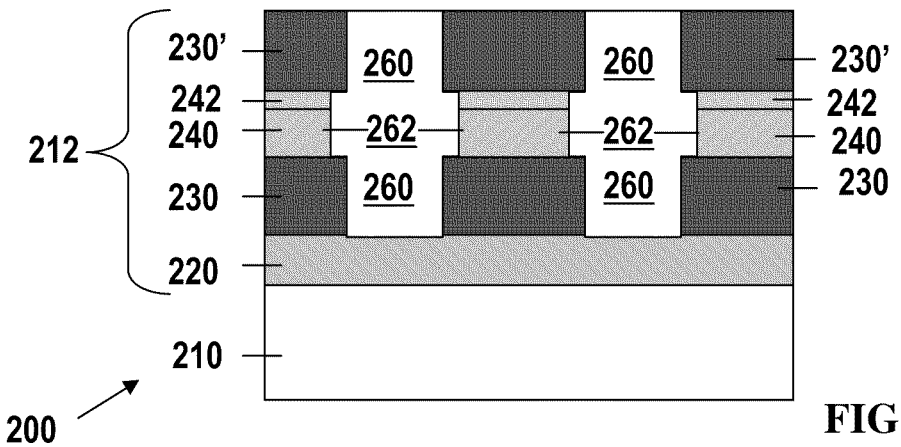

FIG. 2D shows the device 200 of FIG. 2C after selective etching through the columnar pores 260 to form recessed notch or pocket regions 262 in the sidewalls of the capping layer 242 and the gate electrode layer 240. This etching can be achieved by a selective wet etch. The notch or pocket regions 262 are created around the column shaping pores 260 at the place where the sidewalls of the gate electrode layer 240 are exposed by the columnar pores 260.

Figure 2E:
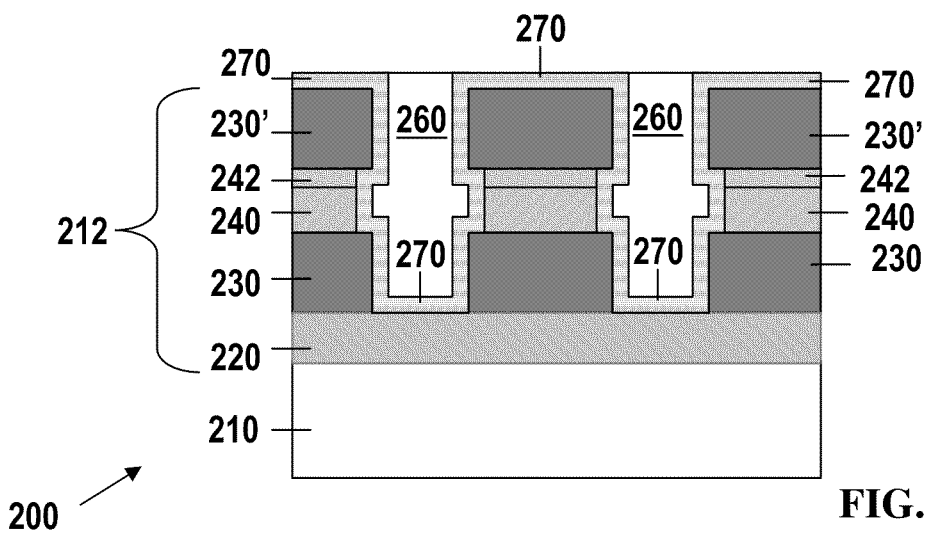

FIG. 2E shows the device 200 of FIG. 2D after a conformal dielectric layer 270 was grown as a selective layer on the sidewalls of the column shaping pores 260 and in the notch or pocket regions 262 the sidewalls of the capping layer 242 and the gate electrode layer 240 by conformal deposition in accordance with one embodiment of the present invention. The dielectric layer 270 which is appropriate for use as a gate dielectric is composed of a material including but not limited to silicon oxide, hafnium oxide, silicon nitride, aluminum oxide, germanium oxide, silicon oxynitride and others.

Figure 2F:
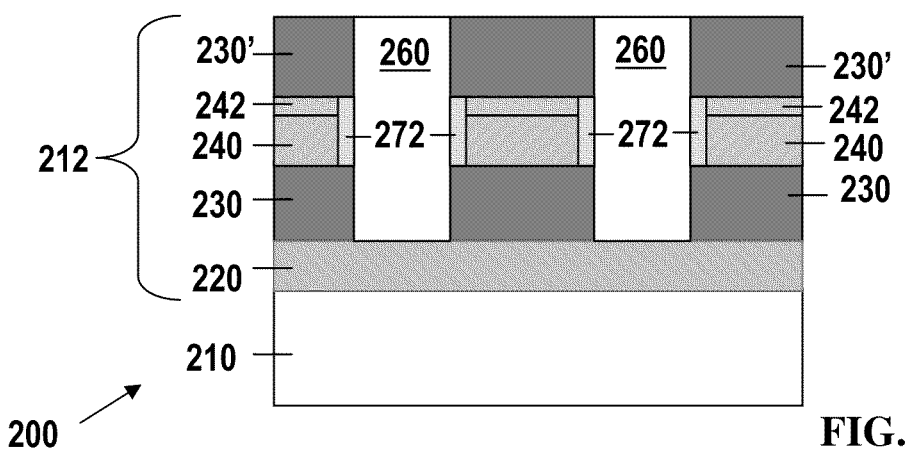

FIG. 2F shows the device 200 of FIG. 2E after the dielectric layer 270 has been selectively etched back by isotropic etching to form a continuous, ring-shaped gate dielectric layer 272 in the notch or pocket regions 262 in the column shaping pores 260 as shown. The dielectric layer 270 is removed on top of the spacer layer 230', at the bottom and the sidewall of the columnar pores 260 as shown in FIG. 2F.

In yet another embodiment of the present invention, the ring-shaped gate dielectric layer 272 can be formed by selectively depositing a precursor of the dielectric such as metal and then converting the precursor into the gate dielectric layer 272 such as oxidizing the metal.

Figure 2G:
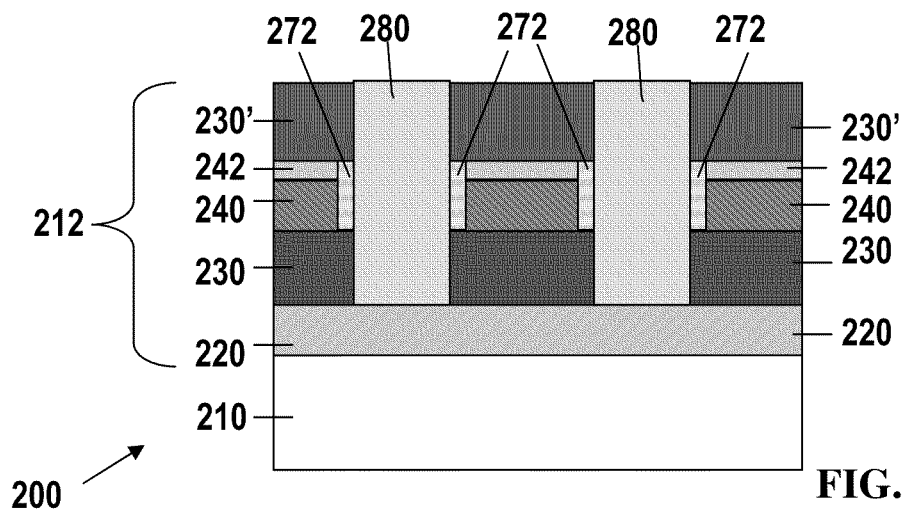

FIG. 2G shows the device 200 of FIG. 2F after a plating process was used to form a pair of columnar, semiconductor nanowires 280 filling the columnar pores 260. The columnar, semiconductor nanowires 280 can be plated with a material selected from the group including, but not limited to, Ge, InSb, InAs, GaAs, GaSb, CdS, CdSe, CdTe, and other II-VI and III-IV compounds. Electroplating can be employed to form the semiconductor nanowires 280 using teachings of electroplating methods in U.S. Pat. No. 2,690,422 of Szekeley entitled "Electroplating of Germanium", U.S. Pat. No. 5,320,736 of Stickney et al. entitled "Method to Electrochemically Deposit Compound Semiconductors", the copending U.S. patent application Ser. Nos. 11/620,224 and 11/620,391 referred to above, and in publications such as Zhang et al. "Fabrication of Highly Ordered InSb Nanowire Arrays by Electrodeposition in Porous Anodic Membranes" Journal of the Electrochemical Society 152 (10), C664-C668 (2005). In the methods of the above references use is made of electrodeposition or atomic layer electrodeposition to form semiconductor materials, such as Ge, InSb, CdTe and other compounds, in amorphous, polycrystalline or single crystalline forms. Alternatively, electroless plating can be employed to form the semiconductor nanowires 280.

FIG. 2G shows the device 200 of FIG. 2F after a plating process was used to form a pair of columnar, semiconductor nanowires 280 filling the columnar pores 260. The columnar, semiconductor nanowires 280 can be plated with a material selected from the group including, but not limited to, Ge, InSb, InAs, GaAs, GaSb, CdS, CdSe, CdTe, and other II-VI and III-IV compounds. Electroplating can be employed to form the semiconductor nanowires 280 using teachings of electroplating methods in U.S. Pat. No. 2,690,422 of Szekeley entitled "Electroplating of Germanium", U.S. Pat. No. 5,320,736 of Stickney et al. entitled "Method to Electrochemically Deposit Compound Semiconductors", the copending U.S. patent applications Ser. Nos. 11/620,224 and 11/620,391 referred to above, and in publications such as Zhang et al. "Fabrication of Highly Ordered InSb Nanowire Arrays by Electrodeposition in Porous Anodic Membranes" Journal of the Electrochemical Society 152 (10), C664 -C668 (2005). In the methods of the above references use is made of electrodeposition or atomic layer electrodeposition to form semiconductor materials, such as Ge, InSb, CdTe and other compounds, in amorphous, polycrystalline or single crystalline forms. Alternatively, electroless plating can be employed to form the semiconductor nanowires 280.

Semiconductor nanowires 280 which have been formed by electroplating can be further processed to modify and achieve a desired crystalline structure. In one exemplary embodiment of the present invention, a single crystalline nanowire composed of Ge is formed by electroplating and a solid state epitaxy method described in the copending U.S. patent application Ser. No. 11/620,224. The method described therein employs a non-aqueous solution containing a Ge precursor such as $GeCl_4$ to electroplate a structure composed of amorphous Ge onto patterned substrates such as silicon (Si). The electroplated amorphous Ge structure is converted into a columnar, single crystal nanowire 280 by using a high temperature annealing process, for example annealing at 400° C. for two hours in a helium atmosphere. The bottom conductive layer 220 is used to carry the electric current or potential for electroplating. The top surface of the semiconductor nanowire 280 can be even with the top surface of the spacer layer 230' as shown in FIG. 2G or can be higher or lower than the top surface of the spacer layer 230', depending on the length of time the electroplating is performed. The top surface of the semiconductor nanowire 280 must be higher than the gate dielectric 272 and the gate electrode layer 240 with the optional capping layer 242. The diameter of the semiconductor nanowire 280 is same as the diameter of the columnar pores 260 shown in FIG. 2F and is in the range from 1 nm to 1000 nm, preferably from 1 nm to 100 nm. After the plating of the semiconductor nanowire 280, a polishing and planarization process is used to planarize the semiconductor nanowire 280 and the spacer layer 230' to the same level. Doping of the semiconductor nanowires 280 to form source regions and drain regions in distal ends of the vertical semiconductor nanowire with an FET channel region between the source region and a drain region, is necessary to form FET devices in accordance with this invention. This doping can be done during plating by electroplating or electroless deposition. Doping of the semiconductor nanowires 280 to form source regions and drain regions is achieved by incorporating other elements therein. Alternatively, it is possible to form such source and drain regions after plating by pre-depositing and post-depositing of dopant and then inter-diffusing the dopant into the semiconductor nanowires 280 at high temperatures.

Figure 2H:
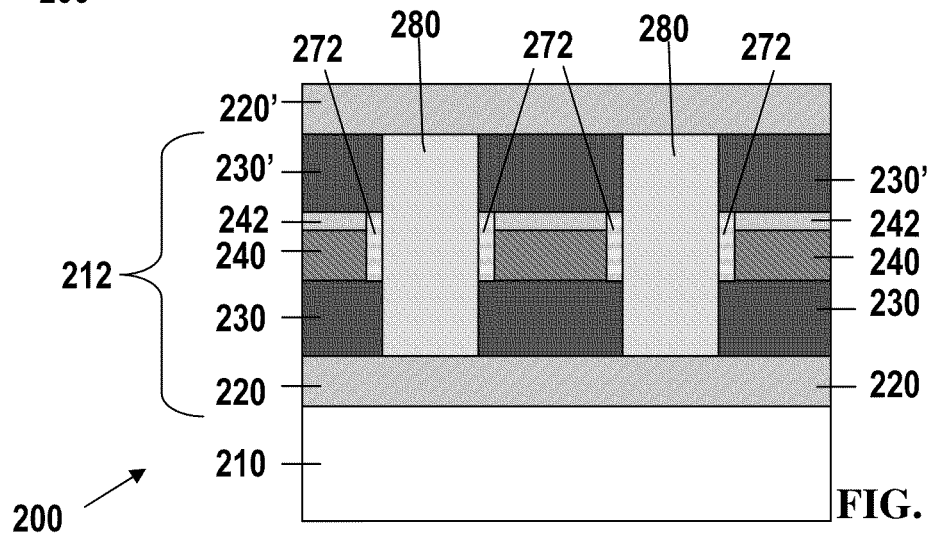

FIG. 2H shows the device 200 of FIG. 2G after a top conductive layer 220' is formed on top of the spacer layer 230' and the semiconductor nanowires 280 to make contacts to the top of the semiconductor nanowires. This top conductive layer 220' serves as the second source or drain electrode. It can be composed of any material that is suitable for the electrode, including but not limited to silicide, germanite, Pt, Pd, Al, Er, Ti, and any combinations or layered structure of the above. The top conductive layer 220', which can be same as or different from the bottom conductive layer 220 can be formed by sputtering, evaporation, PVD, CVD, ALD and any available deposition processes. The top conductive layer 220' can be also formed by a deposition of precursors, such as silicon and metal, and then a reaction to form the conductive layer, such as silicide, from the precursors. The top conductive layer 220' can further be covered by a capping layer (not shown) to protect the top conductive layer 220' from being damaged by exposure to the ambient environment. The material suitable for the top capping layer, which can be same as or different from the spacer layers 230 and 230' includes but not limited to silicon nitride, silicon oxide, aluminum oxide, silicon oxynitride, and other non conductive layers. Such a capping layer can be formed by sputtering, evaporation, PVD, CVD, ALD, spin coating and any available deposition processes.

The vertical FETs fabricated using the method shown in FIGS. 2A to 2H have the plated, columnar, semiconductor nanowires 280 as the device channel, the source and drain electrodes 220 and 220', the spacers 230 and 230', the gate electrode 240, and the ring-shaped gate dielectric structures 272 surrounding the nanowires 280. The gate dielectric structures 272 are formed in the recessed notch or pocket structures 262 which are located between the upper spacer layer 230 and the lower spacer layer 230'. The gate dielectric structures 272 are juxtaposed with and between the sidewalls of the nanowires 280 and the sidewalls of the gate electrode layer 240. The gate electrode layer 240 is also located between and in direct contact with the upper spacer layer 230 and the lower spacer layer 230'.

Second Embodiment

FIGS. 3A to 3H are schematic diagrams showing a method of fabricating a vertical FET with electroplated semiconductor nanowires according to another embodiment of the present invention.

Figure 3A:
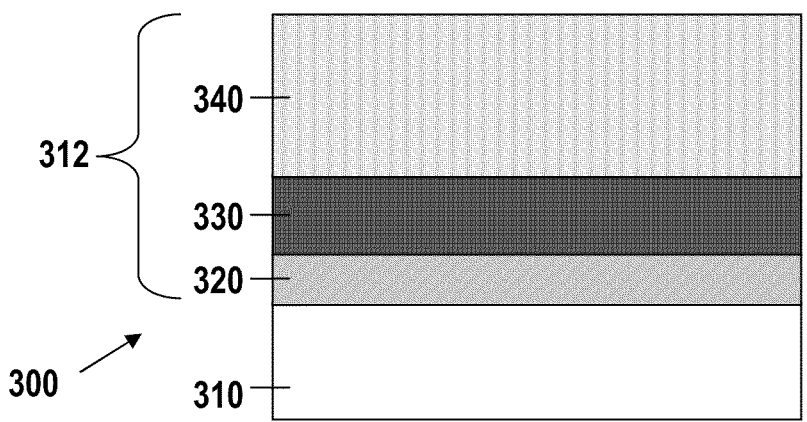
FIG. 3A to 3H are schematic diagrams of another method of fabricating vertical FETs having electroplated semiconductor nanowires and common gate, source and drain electrodes according to another embodiment of the present invention.

FIG. 3A shows a substrate structure 300 in accordance with this invention in an early stage of fabrication thereof consisting of a substrate 310 with a stack 312 of layers formed thereon. The substrate 310 can be composed of a material that is suitable for the substrate 210 in FIG. 2A. The stack of layers comprises layers of conductive layer 320, spacer layer 330, and sacrificial layer 340. The conductive layer 320 is to be formed into the source or drain electrode. The conductive layer 320 and the spacer layer 330 can be composed of any material that is suitable respectively for the bottom conductive layer 220 and the spacer layer 230 as described with reference to FIG. 2A. The sacrificial layer 340 can be composed of any material that can be removed selectively later composed of a material including but are not limited to polymers such as photoresist, UV resist and e-beam resist, dielectrics such as silicon oxide, and metals such as Al, Zn. The material of the sacrificial layer 340 must be different from the material of the spacer layer 330 to allow the selectively removing sacrificial layer 340 without damaging the spacer layer 330. The stack layers 320, 330 and 340 can be deposited sequentially onto the substrate 310 by sputtering, evaporation, PVD, CVD, ALD, electron beam epitaxy, spin coating and any other available deposition processes.

Figure 3B:
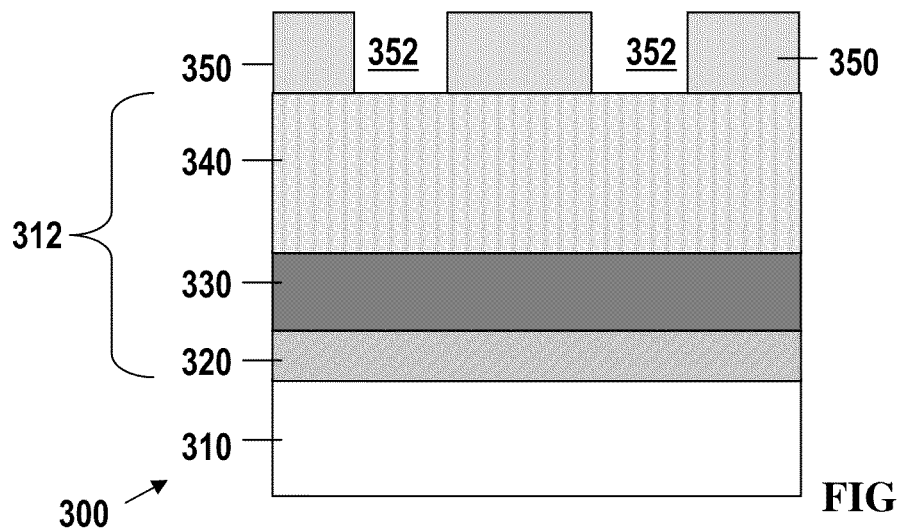

FIG. 3B shows the device 300 of FIG. 3A after a mask patterned for the formation of vias 352 by dry etching was formed on top of the substrate structure 300. The processes employed are preferably similar to the method described with reference to FIG. 2B. The etch mask 350 can be composed of any material suitable for the mask 250 in FIG. 2B.

Figure 3C:
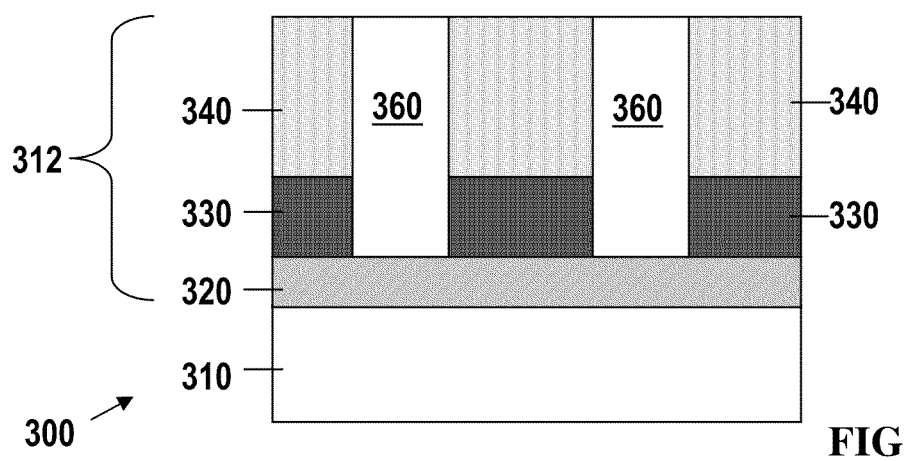

FIG. 3C shows the device 300 of FIG. 3B after an RIE process was used with the mask 350 to create columnar pores 360 in the stack of layers and the mask 350 was stripped away thereafter. The columnar pores 360 pass down through the sacrificial layer 340 and the spacer layer 330 and connect onto the conductive layer 320. After the RIE etching step, the mask 350 was removed by chemical etch process, such as dissolving in a proper solvent.

Figure 3D:
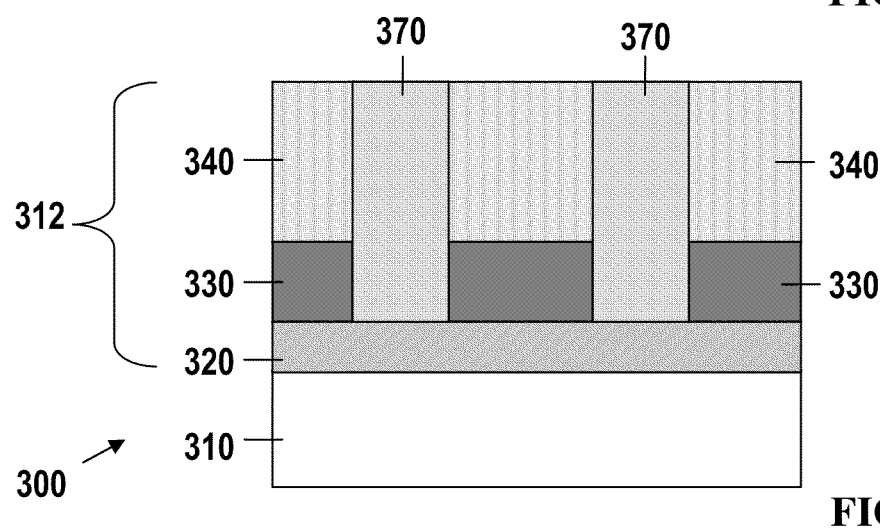

FIG. 3D shows the device 300 of FIG. 3C after columnar, semiconductor nanowires 370 were formed by electroplating into column shaping pores 360 using the process described in FIG. 2G. The semiconductor nanowires 370 can be formed by plating with a material selected from the group including but not limited to Ge, InSb, InAs, GaAs, GaSb, CdS, CdSe, CdTe, and other II-VI and III-IV compounds. The electroplated semiconductor nanowires 370 can be further processed to modify and achieve the desired crystalline structure as described with reference to FIG. 2G. The conductive layer 320 is used to carry the electric current or potential for electroplating. The top surface of the semiconductor nanowires 370, as plated, can be even with the top surface of the sacrificial layer 340 as shown in FIG. 2G. Alternatively the semiconductor nanowires 370, as plated, can be higher or lower than the top surface of the sacrificial layer 340, depending on the duration of the electroplating process. The top surface of the semiconductor nanowires 370, as plated and thereafter, must be higher than the spacer layer 330 by at least the gate length of the devices to be built. The diameter of the semiconductor nanowires 370 is same as the diameter of the columnar pores 360 shown in FIG. 3C and is in the range from 1 to 1000 nm, preferably from 1 to 100 nm. After the plating of the semiconductor nanowires 370, an optional polishing and planarization process can be used to flatten the semiconductor nanowires 370 and the sacrificial layer 340 to be coplanar on the top surfaces thereof, as shown by FIG. 3D.

Figure 3E:
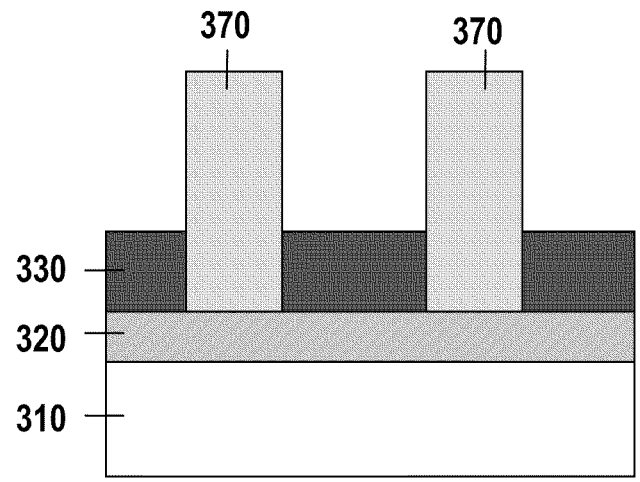

FIG. 3E shows the device 300 of FIG. 3D after removal of the sacrificial layer 340 exposing the semiconductor nanowires 370 extending above the spacer layer 330. The sacrificial layer 340 can be removed by a selective etching process, such as wet etching or dry etching. In one embodiment of the present invention the sacrificial layer 340 comprises photoresist which is selectively removed by dissolving in acetone. The spacer layer 330 and the semiconductor nanowires 370 are not damaged in this selective removal process.

Figure 3F:
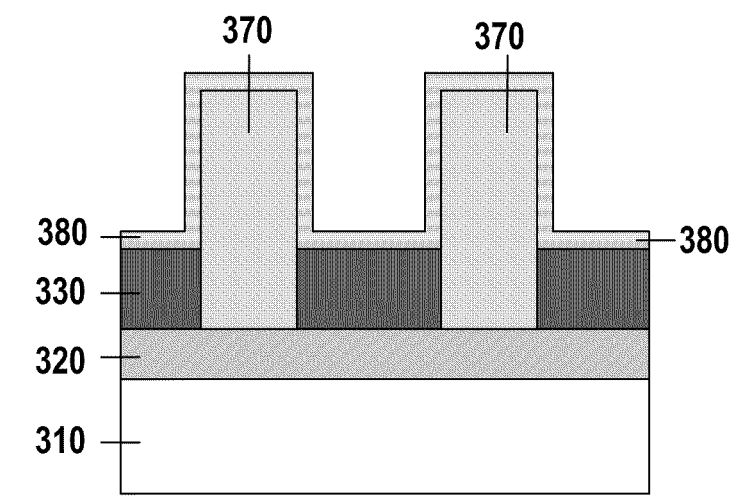

FIG. 3F shows the device 300 of FIG. 3E after a blanket, conformal, gate dielectric layer 380 was deposited covering the top surface of the lower spacer layer 330, the top surface of the semiconductor nanowires 370, and the sidewall of the exposed portion of the columnar, semiconductor nanowires 370. The gate dielectric layer 380, which can be of any material suitable for the layer 270 described in the FIG. 2E, can be deposited by CVD, ALD or another conformal deposition process.

Figure 3G:
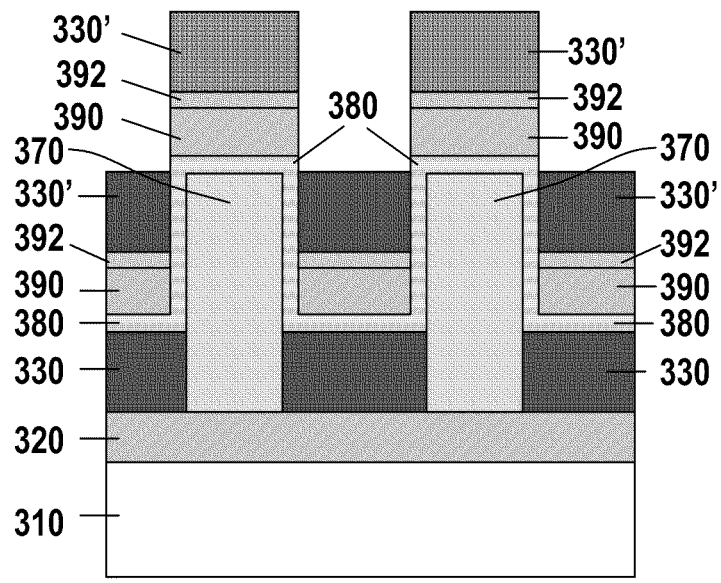

FIG. 3G shows the device 300 of FIG. 3F after a gate electrode layer 390, a capping layer 392 and a spacer layer 330' were deposited sequentially followed by patterning using conventional masking and etching, as will be well understood by those skilled in the art. The gate electrode layer 390, capping layer 392 and spacer layer 330" are deposited using a directional deposition process, such as evaporation or PVD. The gate electrode layer can further include a capping layer 392 to protect the gate electrode layer 390 from being damaged by deposition of the spacer layer 330'. The gate layer 390 can be composed of any material suitable for the gate layer 240 of FIG. 2A. The capping layer 392 can be composed of any material suitable for the capping layer 242 of FIG. 2A. The thickness of the gate layer 390 is determined by the gate length of the device to be built. The total thickness of the gate layer 390 and the optional capping layer 392 has to be controlled so that the top surface of the capping layer 392 is lower than the top surfaces of the semiconductor nanowires 370. The spacer layer 330' can be composed of material suitable for the spacer layer 230' of FIG. 2A, which may be the same material as spacer layer 330 or a different material. The top surface of the spacer layer 330' can be even with the top surface of the semiconductor nanowires 370 as shown or alternatively can be higher than or lower than the top surface of the semiconductor nanowires 370. Because the deposition method is a highly directional process, the gate electrode layer 390, the optional capping layer 392 and the spacer layer 330' are also deposited on the top surface of the semiconductor nanowires 370.

Figure 3H:
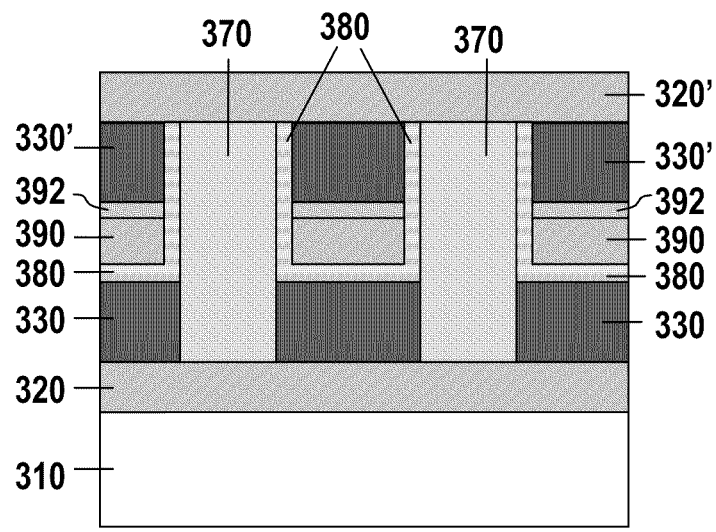

FIG. 3H shows the device 300 of FIG. 3G after polishing processes are firstly used to planarize the device 300, thereby removing the gate electrode layer 390, the capping layer 392, the spacer layer 330', and the gate dielectric layer 380 from the top surfaces of the columnar, semiconductor nanowires 370, thereby exposing those top surfaces. Then a conductive layer 320' is deposited over the top surfaces of the semiconductor nanowires 370, the top surfaces of the spacer layer 330', and the top surfaces of the gate dielectric layer 380. This conductive layer 320' can be of any material that is suitable for the top conductive layer 220' described with reference to FIG. 2H, and can be either the same or different from the conductive layer 320. The conductive layer 320' can be formed with methods described in the FIG. 2H for the layer 220'. Optionally, this conductive layer 320' can further be covered by a capping layer to protect the conductive layer 320' from damage by exposure to the ambient environment as described with reference to FIG. 2H. The gate dielectric tube 380 is formed in an elongated pocket or notch which extends vertically from the top surface of the lower spacer layer 430. In addition, the gate dielectric tube 380 is laterally juxtaposed and in direct contact with both the sidewalls of the nanowire 370 and the sidewalls of the gate electrode layer 390. The gate electrode layer 390 is in direct contact with and vertically positioned between and the lower spacer layer 430 and the upper spacer layer 430'.

The vertical FETs fabricated using the method shown in FIGS. 3A to 3H include the plated, columnar semiconductor nanowires 370 which serve as the device channel of the FET plus the source/drain electrodes 320 and 320', the spacers 330 and 330', the gate electrode 390, and the tube-shaped gate dielectric 380 structures surrounding the nanowires 370.

Third Embodiment

FIGS. 4A to 4H are schematic diagrams showing a further alternative method of fabricating a vertical FET with electroplated semiconductor nanowires according to a third embodiment of the present invention.

Figure 4A:
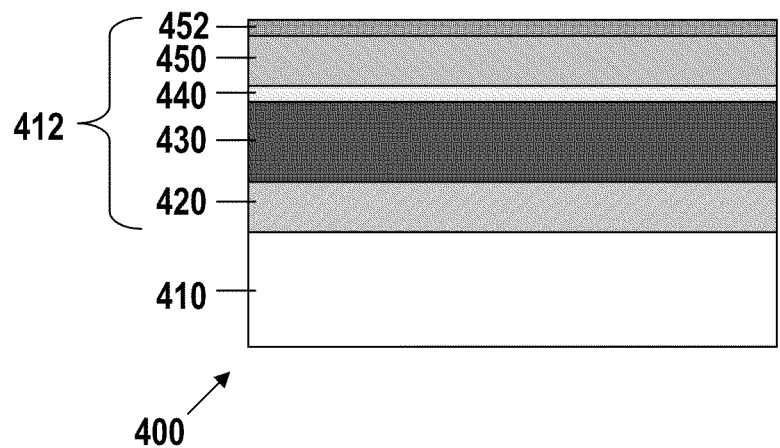
FIG. 4A to 4J are schematic diagrams of another method of fabricating vertical FETs having electroplated semiconductor nanowires and common gate, source and drain electrodes according to yet another embodiment of the present invention.

FIG. 4A shows a substrate structure 400 consisting of a substrate 410 and a stack 412 of layers on the substrate 410. The stack of layers comprises a conductive layer 420, a spacer layer 430, and a gate electrode layer 450 and an optional capping layer 452 on top to protect the gate electrode layer 450 from being damaged in subsequent processing. Between the spacer layer 430 and the gate electrode layer 450, the stack can also have an optional gate dielectric layer 440. The substrate 410 can be composed of any material that is suitable for the substrate 210 in FIG. 2A. The conductive layer 420 serves as the source or drain electrode and it can be composed of any material that is suitable for the bottom conductive layer 220 in FIG. 2A. The spacer layer 430 can be composed of any material that is suitable for the spacer layer 230 in FIG. 2A. The optional gate dielectric layer 440 can be of any material suitable for the gate dielectric layer 270 shown in FIG. 2E. The gate layer 450 can be composed of any material for the gate electrode layer 240 described in FIG. 2A. The gate capping layer 452 can be composed of any material suitable for the capping layer 242 in FIG. 2A. The thickness of the gate layer 450 is determined by the gate length of the device to be built. All the layers of material in the stack can be formed by sputtering, evaporation, physical vapor deposition (PVD), chemical vapor deposition (CVD), atomic layer deposition (ALD), electron beam epitaxy, spin coating and any other deposition processes that are available.

Figure 4B:
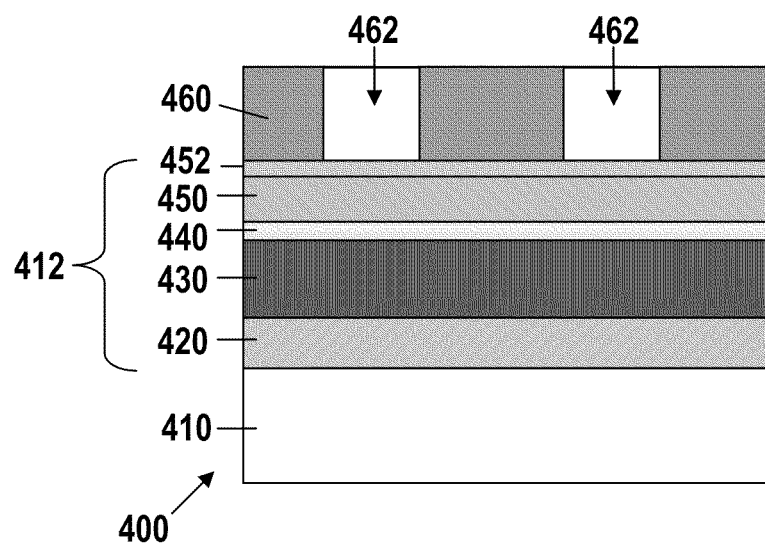

FIG. 4B shows the device 400 of FIG. 4A after formation of a dry etch mask 460 with vias 462 on top of the substrate structure 400. The etch mask 460 can be composed of any materials suitable for the mask 250 in FIG. 2B. The vias 462 are patterned by UV lithography, electron beam lithography or other similar methods. The etch mask can be composed of any materials suitable for the mask 250 in FIG. 2B.

Figure 4C:
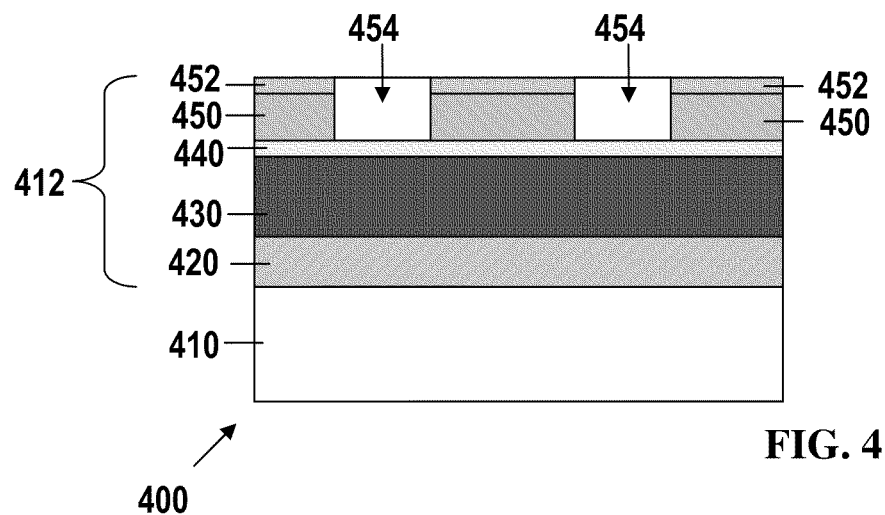

FIG. 4C shows the device 400 of FIG. 4B after reactive ion etching was used with the mask 460 to create columnar pores 454 in the gate electrode layer 450 with the optional capping layer 452. The columnar pores 454 pass down through the capping layer 452 and the upper gate electrode layer 450 and reach down to expose the top surface of the optional gate dielectric layer 440. In the absence of the optional gate dielectric layer 440 the columnar pores would reach down to expose the spacer layer 430. After the formation of the columnar pores 454, the mask 460 was removed by chemical etch process, such as dissolving in a proper solvent.

Figure 4D:
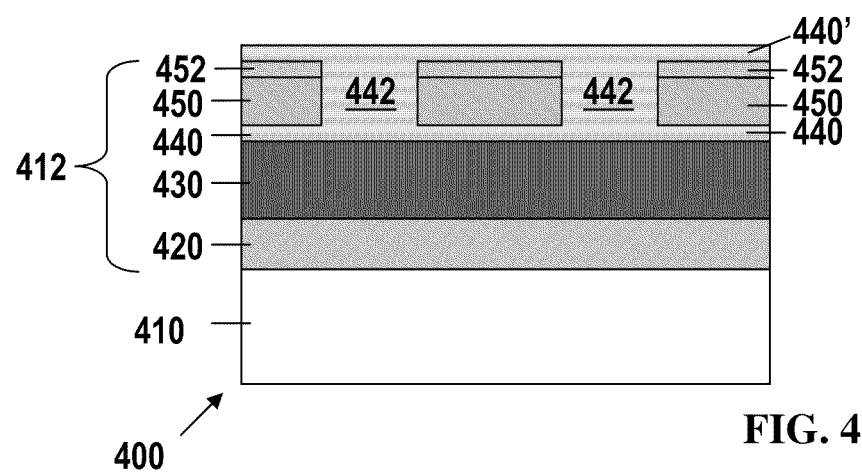

FIG. 4D shows the device 400 of FIG. 4C after a gate dielectric layer 440' is formed in the columnar pores 454 to form dielectric pads 442. The gate dielectric material is formed on top of the optional gate dielectric layer 440 (shown) or on top of the spacer layer 430 (not shown). The thickness of the dielectric pads 442 is at least as thick as the gate layer 450 with the optional capping layer 452. The top surface of the dielectric pads 442 can be even with or higher than the capping layer 452 (not shown). The dielectric pads 442 can be of any material suitable for the gate dielectric as described for the layer 270 in FIG. 2E. The material of the dielectric pads 442 can be same or different from, bur preferably same as the optional layer 440. The dielectric pads 442 can be formed by sputtering, evaporation, CVD, PVD, spin coating, or any other processes that are available. In a preferred embodiment of the present invention, the deposition of gate dielectric may continue after the filling of the columnar pores 454 and the formation of the dielectric pads 442, so that an optional, continuous gate dielectric film 440' is formed on top of the optional capping layer 452, as shown, or on top of the gate layer 450 (not shown.) The optional, continuous gate dielectric layer 440' can also be formed by two steps. The first step is to polish and planarize the dielectric pads 442 with the gate electrode layer 450 or the capping layer 452. The second step is to deposit the gate dielectric layer 440'.

Figure 4E:
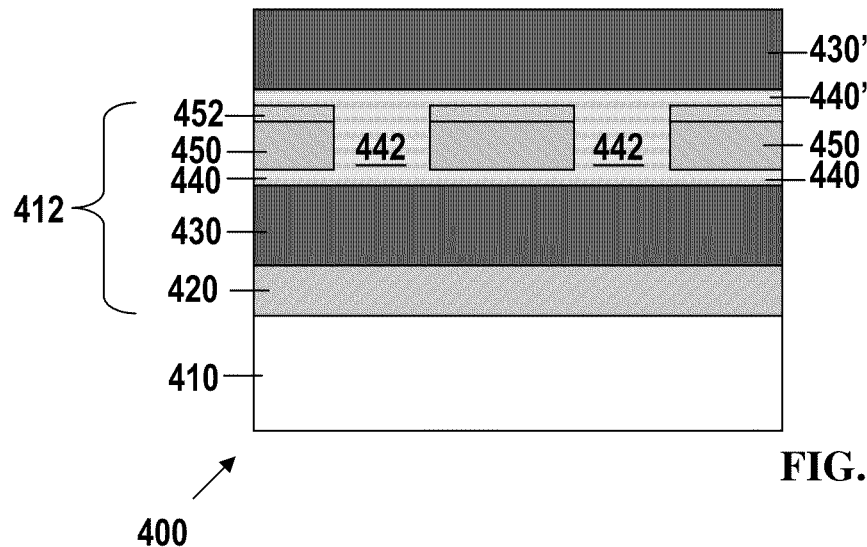

FIG. 4E shows the device 400 of FIG. 4D after an upper spacer layer 430' is formed on top of the gate dielectric layer 440'.

In other embodiments of the present invention, the gate dielectric layer 440' is omitted and the spacer layer 430' is formed on top of the gate dielectric layer 442 and the optional gate capping layer 452. The spacer layer 430', which can be formed by sputtering, evaporation, CVD, PVD, spin coating, or any other processes that are available can be composed of any material that can be same as or different from, but preferably same as, the spacer layer 430, which is suitable for the spacer layer 230 in FIG. 2A.

Figure 4F:
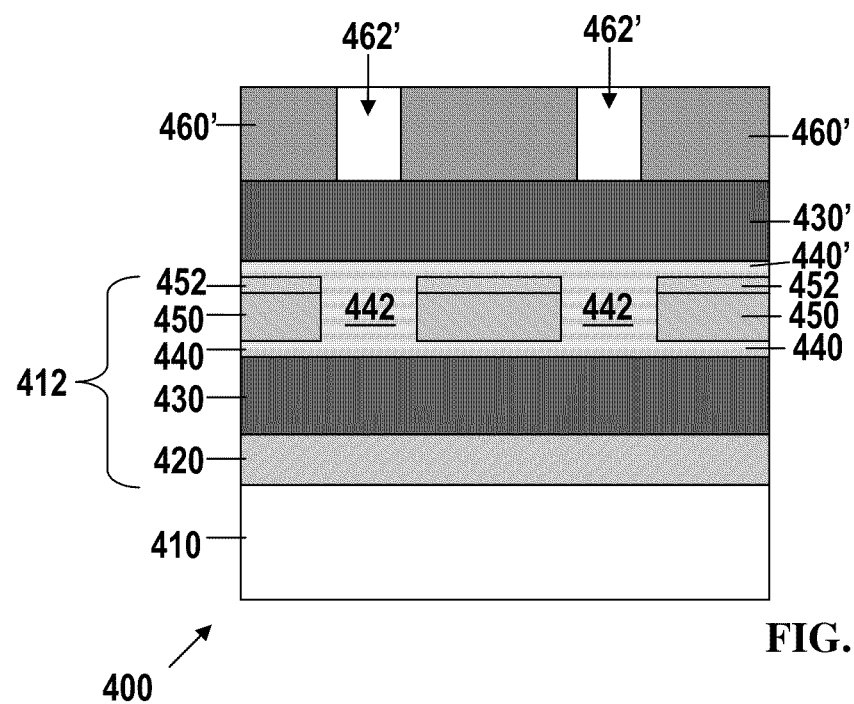

FIG. 4F shows the device 4oo of FIG. 4E after a dry etch mask 460' with vias 462' was formed on top of the spacer layer 430'. The etch mask 460' can be composed of any materials suitable for the mask 250 in FIG. 2B. The vias 462' are patterned by electron beam lithography or other processes with high precision. The vias 462' are in alignment and concentric with the gate dielectric pads 442 which larger diameters smaller than the corresponding vias 462', but with a smaller diameter than the gate dielectriv pads 442.

Figure 4G:
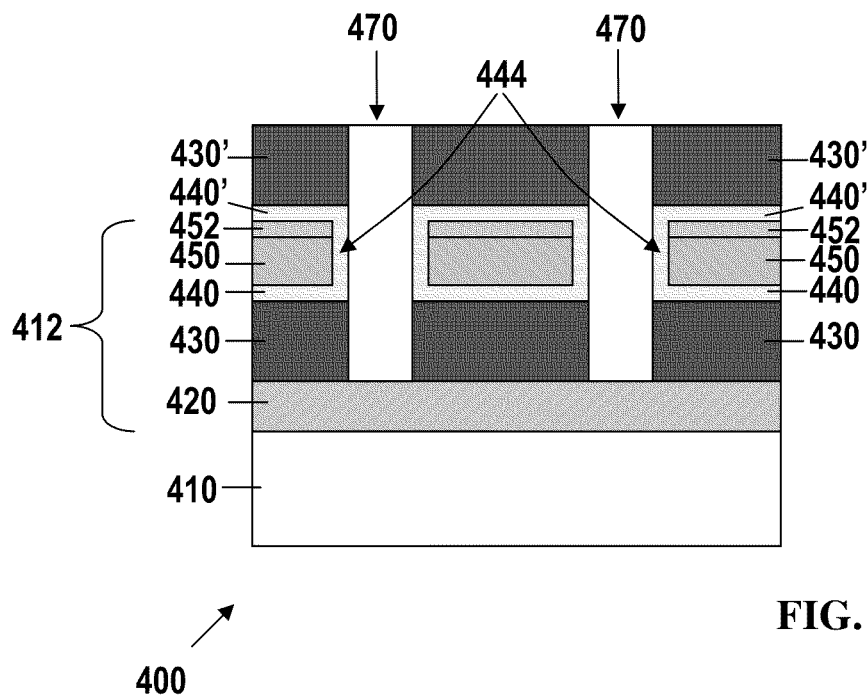

FIG. 4G shows the device 400 of FIG. 4F after RIE etching was used with the mask 460' to create columnar pores 470 in the stack 412 of layers. The columnar pores 470 pass down through the spacer layer 430', the gate dielectric pads 442, the two optional gate dielectric layers 440 and 440', and the upper spacer layer 430, and connect onto the conductive layer 420. The center part of the gate dielectric pads 442 shown in FIG. 4F is etched and a ring shaped, gate dielectric tube 444 is formed in a pocket or notch on the sidewalls of the columnar pores 470, vertically between and in direct contact with the upper spacer layer 430' and the lower spacer layer 430. The length of the ring shaped, gate dielectric tube 444 is determined by the thickness of the pads 442, and the thickness is determined by the difference between the diameters of the columnar pores 454 shown in FIG. 4C and the columnar pores 470 shown in FIG. 4G. After the formation of the columnar pores 470, the mask 460' was removed by chemical etch process, such as dissolving in a proper solvent ready for formation of the columnar nanowires 480 in the columnar pores 470, as shown in FIG. 4H.

Figure 4H:
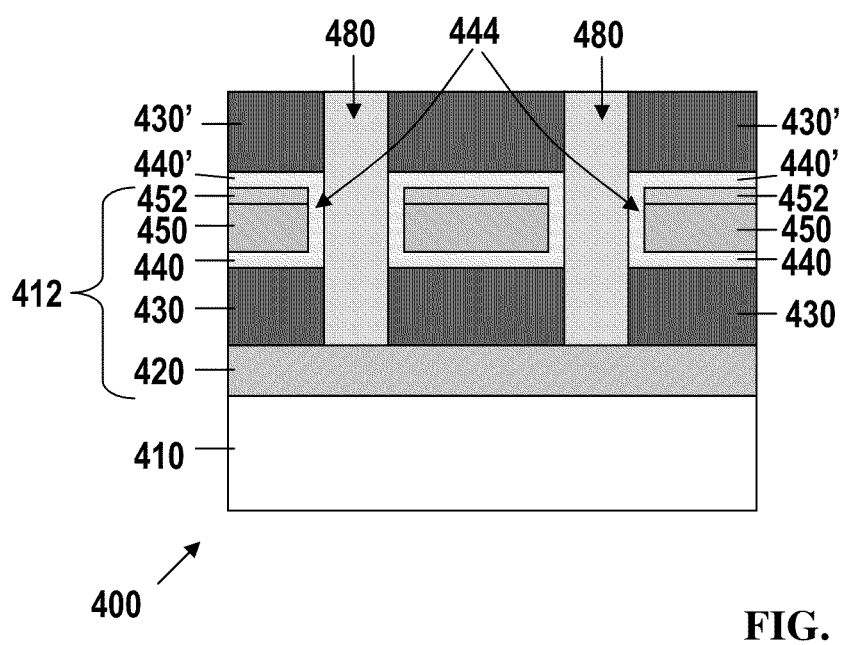

FIG. 4H shows the device 400 of FIG. 4G after semiconductor nanowires 480 are formed by electroplating with the similar process described in FIG. 2G. The semiconductor nanowire that can be plated includes but not limited to Ge, InSb, InAs, GaAs, GaSb, CdS, CdSe, CdTe, and other II-VI and III-IV compounds. The electroplated semiconductor 480 can be further processed to modify and achieve the desired crystalline structure as described for in FIG. 2G. The conductive layer 420 is used to carry the electric current or potential for electroplating. The top surface of the semiconductor nanowire 480 can be even with (shown in FIG. 4H), higher (not shown) or lower (not shown) than the top surface of the spacer layer 430', depending on how long the electroplating is performed. The top surface of the semiconductor nanowire 480 must be higher than the gate dielectric layer 440'. The diameter of the semiconductor nanowire 480 is same as the diameter of the columnar pores 470 shown in FIG. 4G and is in the range from 1 to 1000 nm, preferably from 1 to 100 nm. After the plating of the semiconductor nanowire 480, an optional polishing and planarization process can be used to flatten the semiconductor nanowire 480 and the spacer layer 430'. In one embodiment of the present invention, the semiconductor nanowire 480 is wrapped by a ring shaped, gate dielectric tube 444 and a gate electrode 450.

In another embodiment of the present invention, the gate electrode layer pattern 442 in FIG. 4D are stripes and the semiconductor nanowire 480 in FIG. 4H has a double gate 450 with the ring shaped, gate dielectric tube 444 at two opposite sides of the semiconductor nanowire 480. In another embodiment of the present invention, the gate electrode layer pattern 442 in FIG. 4D are stripes and the semiconductor nanowire 480 in FIG. 4H has a single gate 450 with the ring shaped, gate dielectric tube 444 at one side of the semiconductor nanowire 480.

Figure 4I:
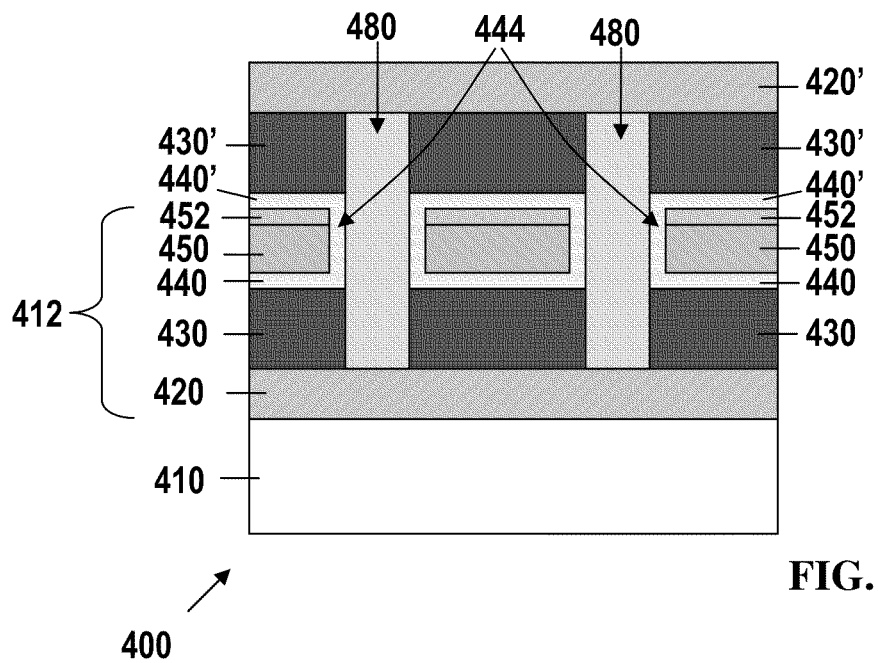

FIG. 4I shows the device 400 of FIG. 4H after a conductive layer 420' is formed on top of the spacer layer 430' and the semiconductor nanowire 480 to make contacts to the top of the semiconductor nanowires. This conductive layer 420' serves as the second source or drain electrode. This conductive layer 420' can be of a material that is suitable for the top conductive layer 220' described in FIG. 2H, and can be same or different from the conductive layer 420. The conductive layer 420' can be formed with methods similar to the top conductive layer 220' described in the FIG. 2H. This conductive layer 420' can further comprise a capping layer (not shown) to protect the conductive layer 420' from being damaged by exposure to the ambient environment, as described in FIG. 2H.

The vertical FETs fabricated using the method shown in FIGS. 4A to 4H have the plated semiconductor nanowire 480 as the device channel, the source/drain electrodes 420 and 420', the lower spacer 430 and the upper spacer 430', the gate electrode 450, and the ring shaped, gate dielectric tube 444. The dielectric tube 444 is positioned vertically between and in direct contact with the lower spacer 430 and in direct contact with the upper spacer 430'. In the lateral direction, the dielectric tube 444 is juxtaposed with and in direct contact with the sidewalls of the columnar nanowire 480 and the gate electrode 450.

Figure 4J:
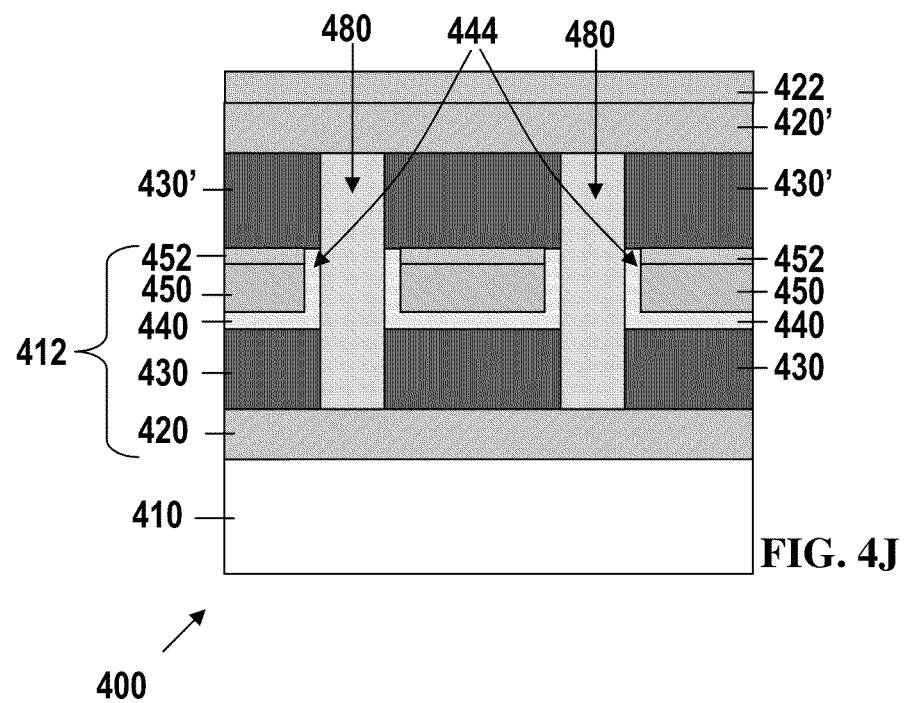

FIG. 4J shows the device 400 of FIG. 4I after an FET has been fabricated with the method similar to that of FIGS. 4A to 4I, without the two optional gate dielectric layers 440 and 440'. An optional capping layer 422 is formed on top of the top source drain electrode 420' to protect the conductive layer 420' from being damaged by exposure to the ambient environment and other processes. The material suitable for the capping layer 422 includes, but is not limited to, silicon nitride, silicon oxide, aluminum oxide, silicon oxynitride, and other non conductive layers. The capping layer 422 can be same as or different from the spacer layers 430 and 430', and can be formed by sputtering, evaporation, PVD, CVD, ALD, spin coating and any other available deposition processes. Each FET device of FIG. 4J has the plated, cylindrical, columnar, semiconductor nanowire 480 as the device channel, the source/drain electrodes 420 and 420', the spacers 430 and 430', the gate electrode 450, and the ring-shaped, gate dielectric tube 444 surrounding the nanowire 480.

Fourth Embodiment

Figure 5A:
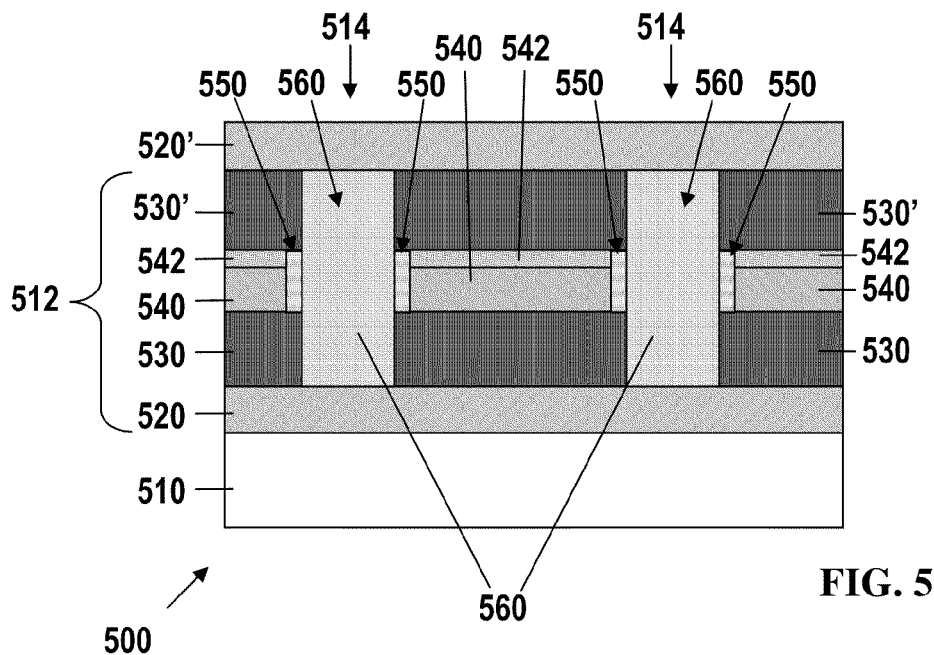
FIG. 5A to 5P are schematic diagrams of a method of fabricating arrays of isolated vertical FETs having electroplated semiconductor nanowires and separate gate, source and drain electrodes according to one embodiment of the present invention.
Figure 5B:
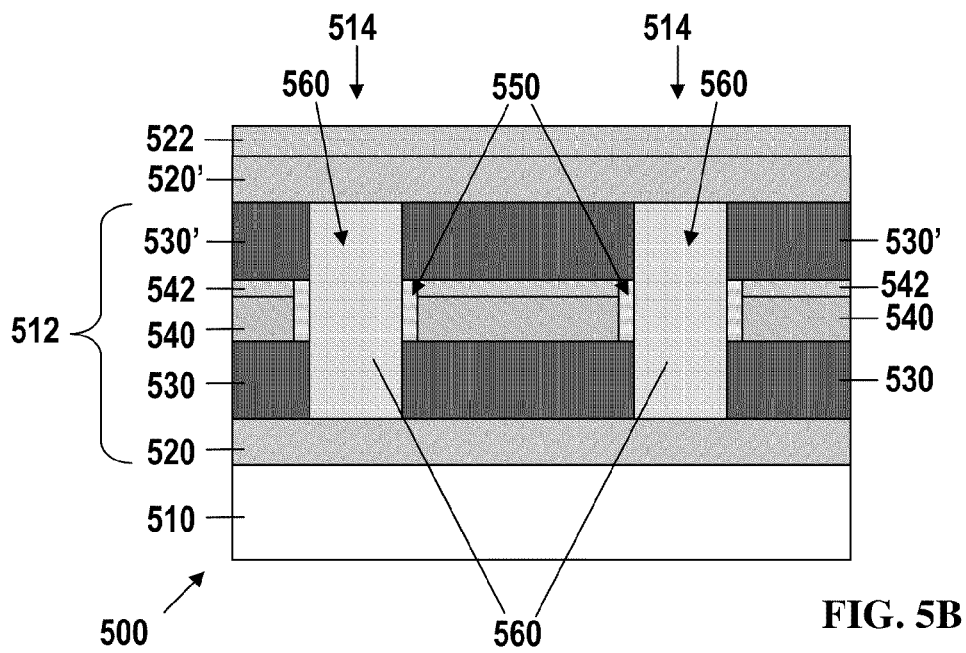
Figure 5C:
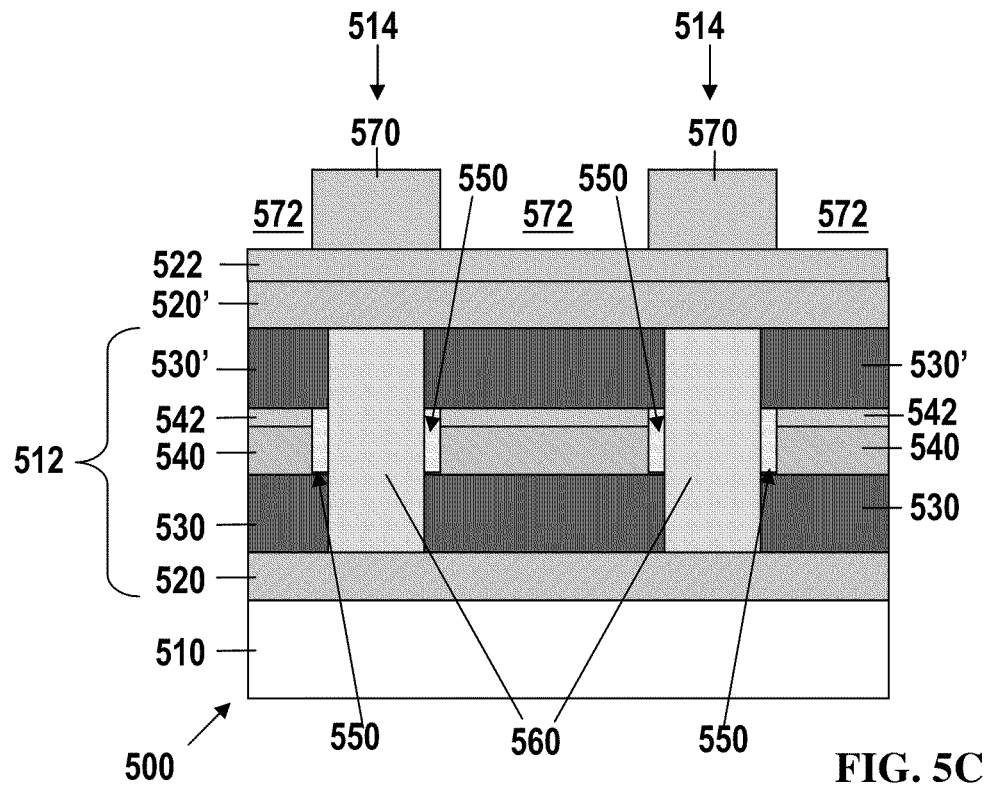
Figure 5D:
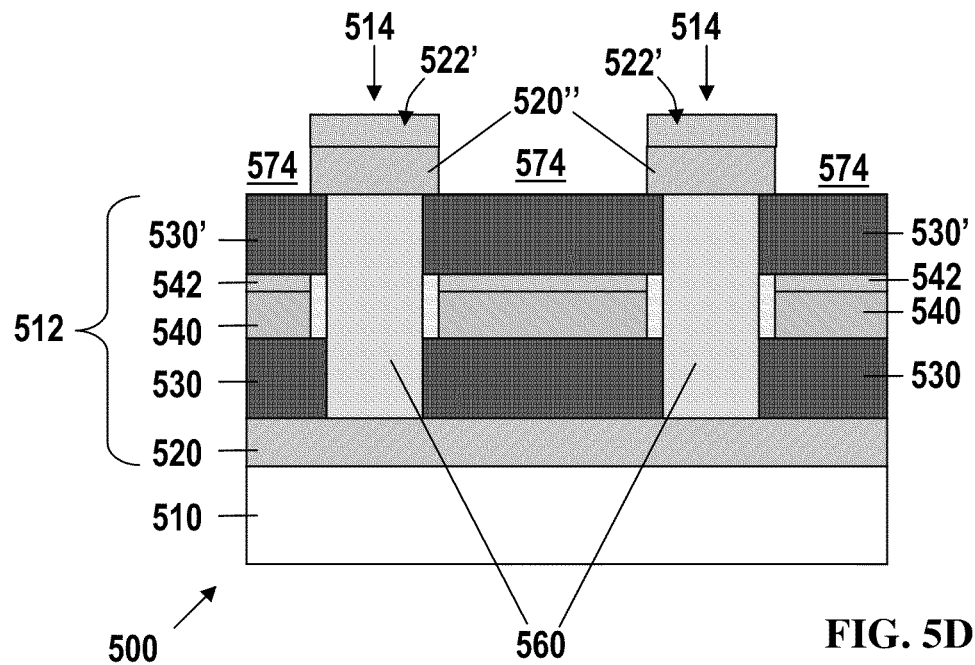
Figure 5E:
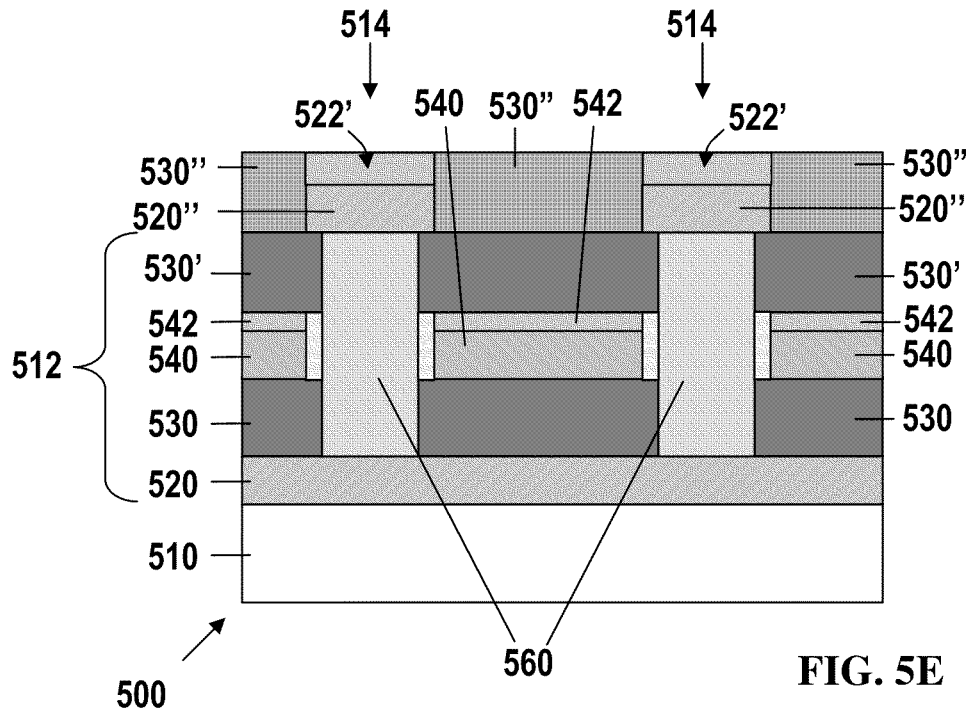
Figure 5F:
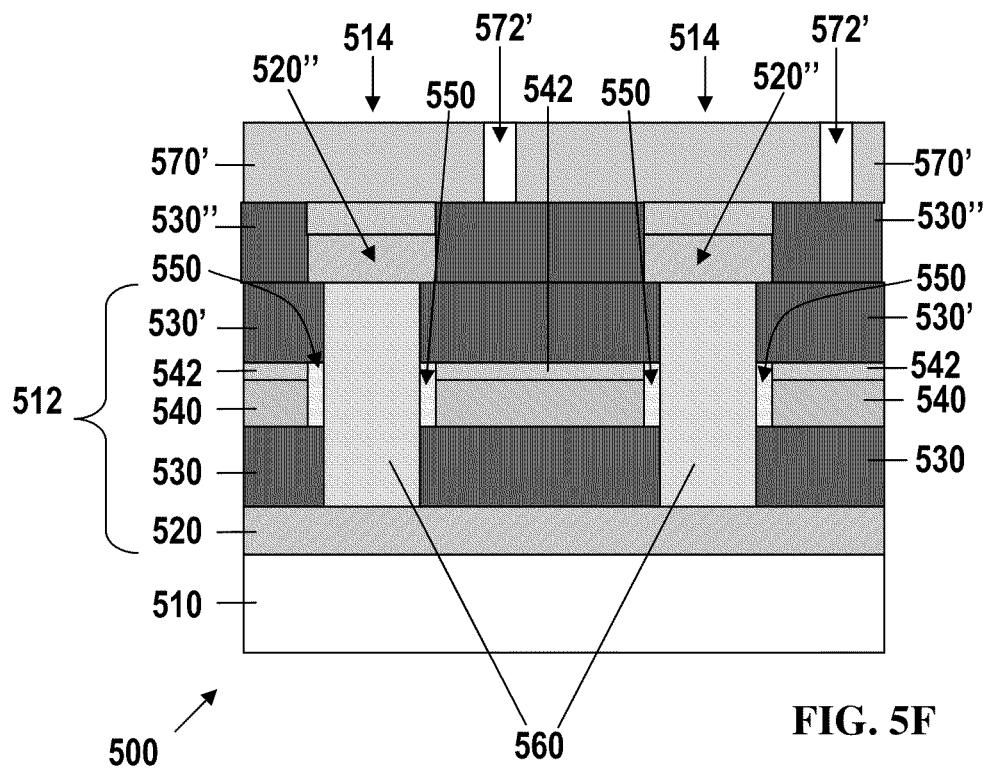
Figure 5G:
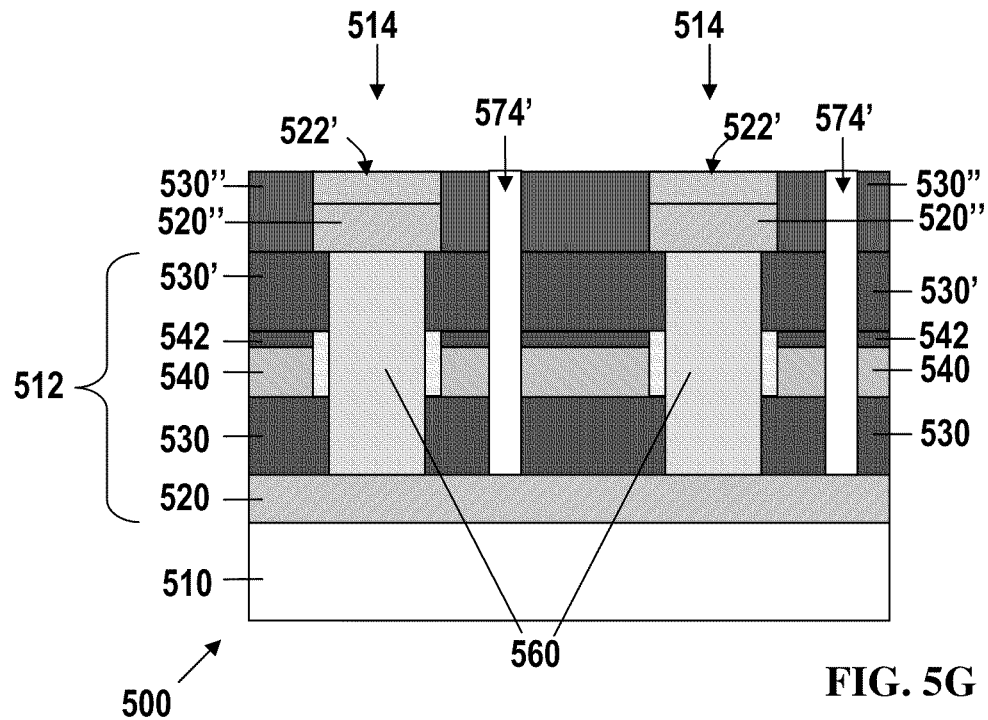
Figure 5H:
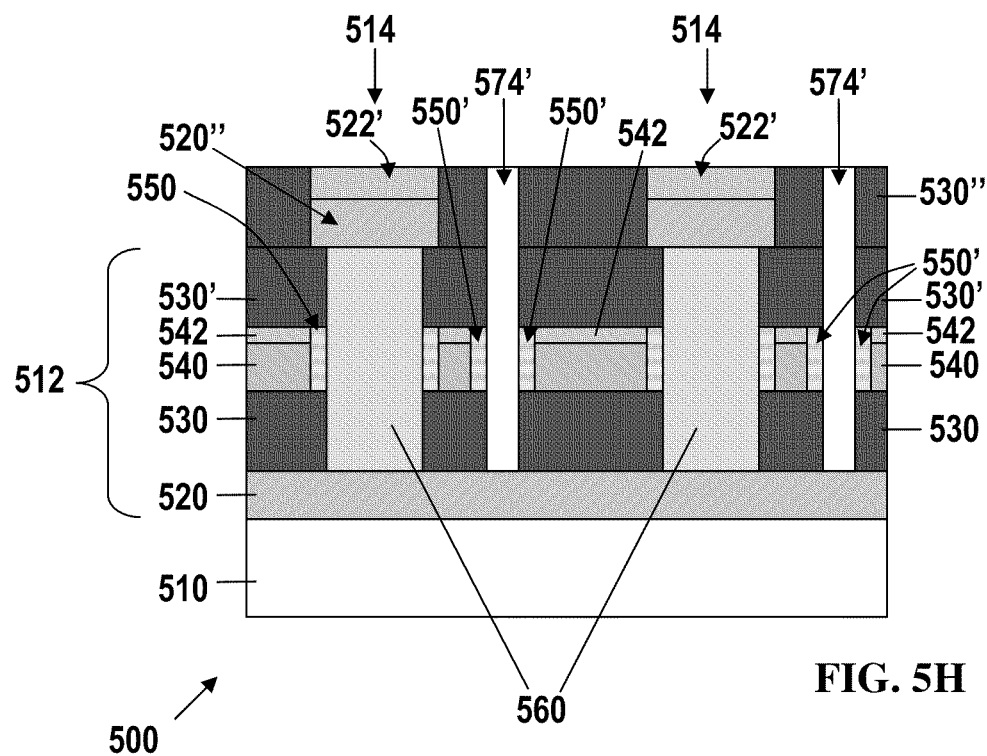
Figure 5I:
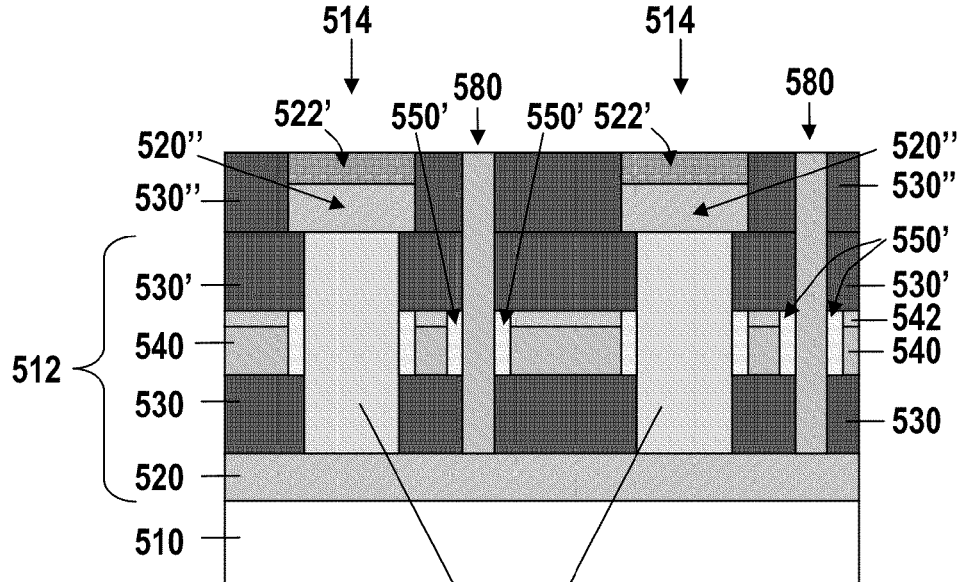
Figure 5J:
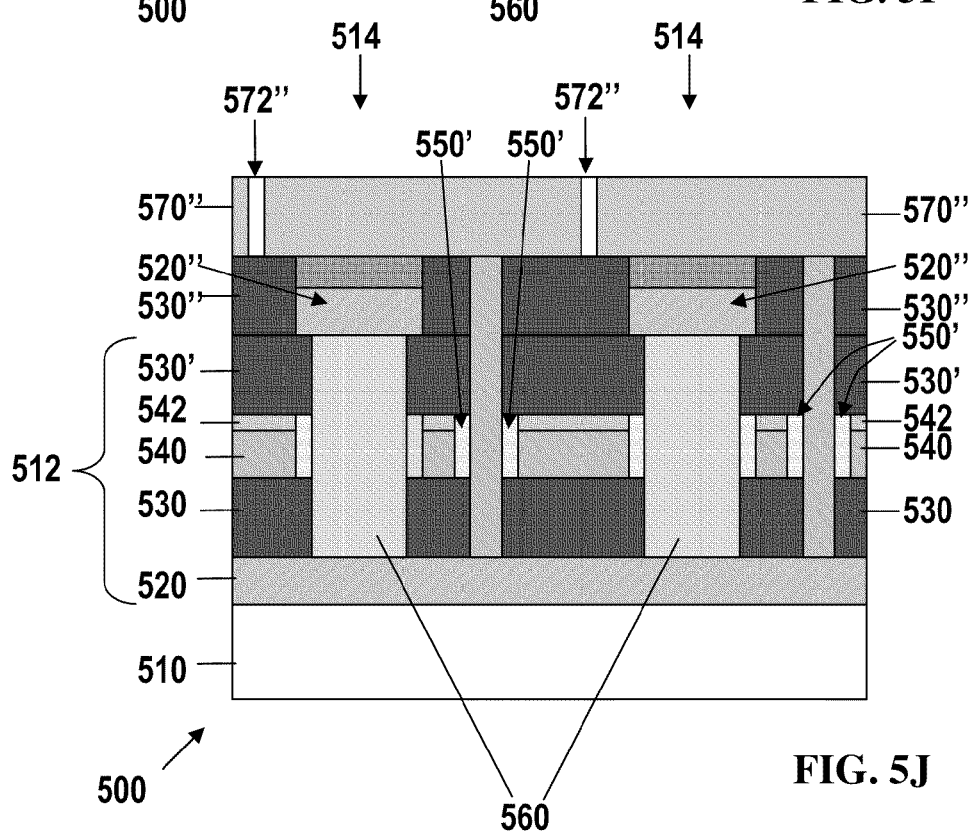
Figure 5K:
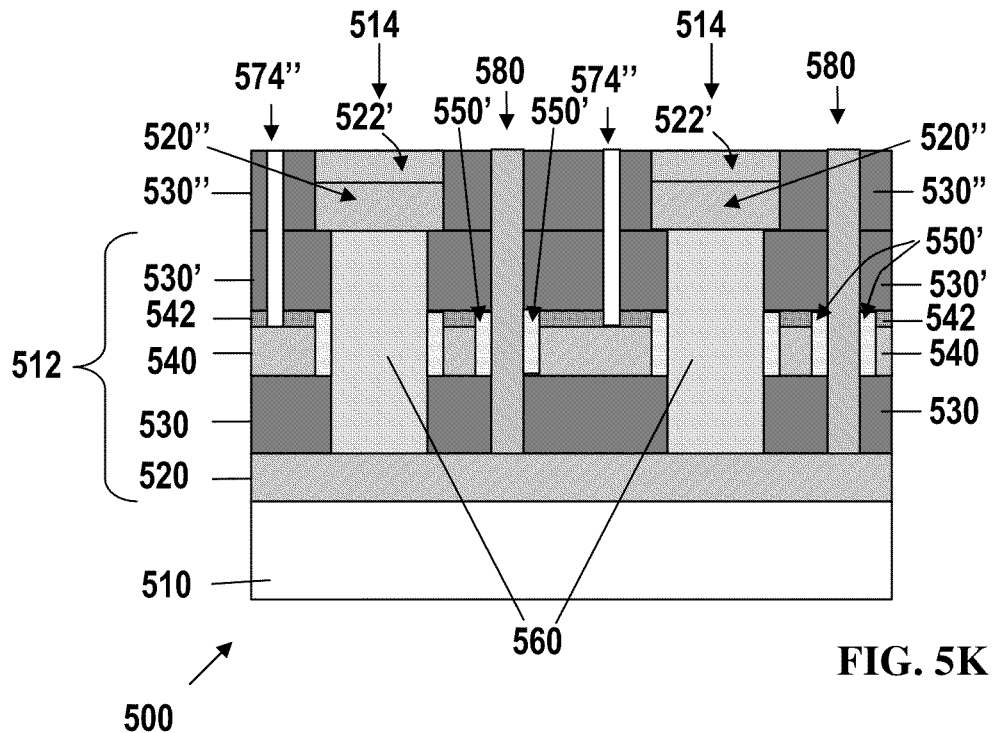
Figure 5L:
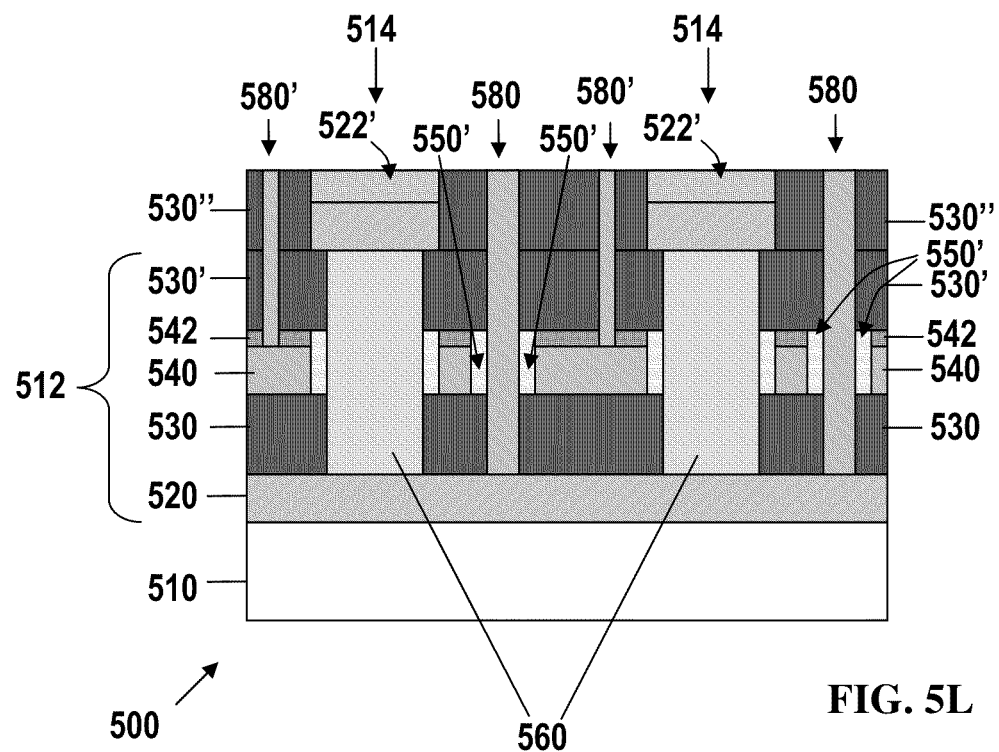
Figure 5M:
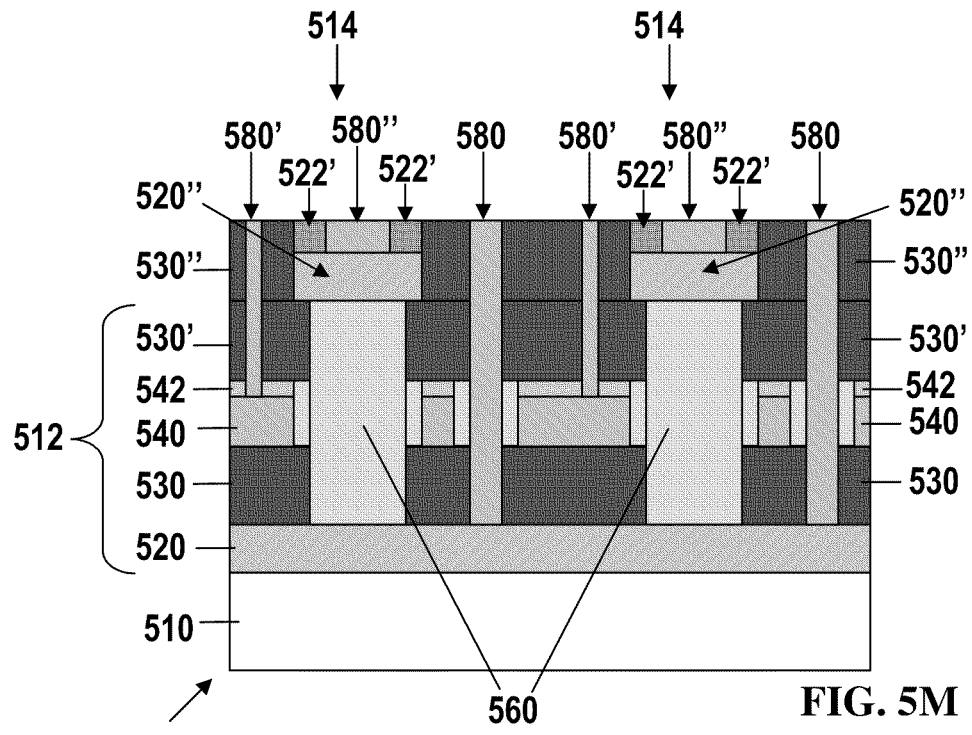
Figure 5N:
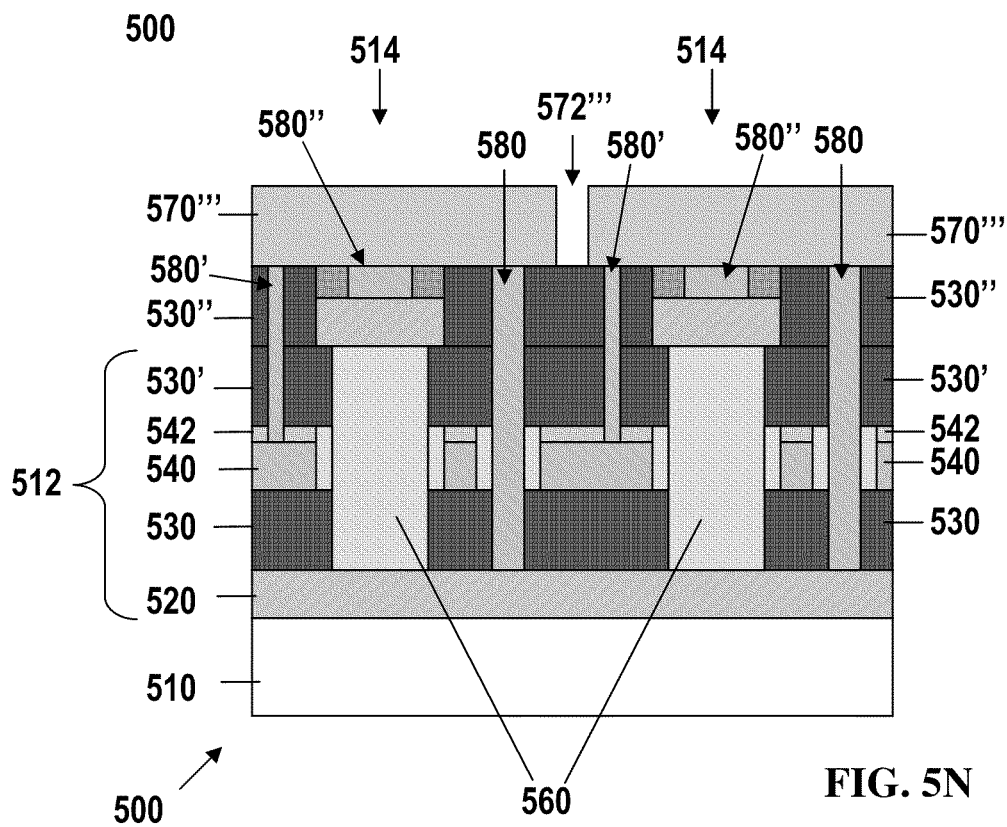
Figure 5O:
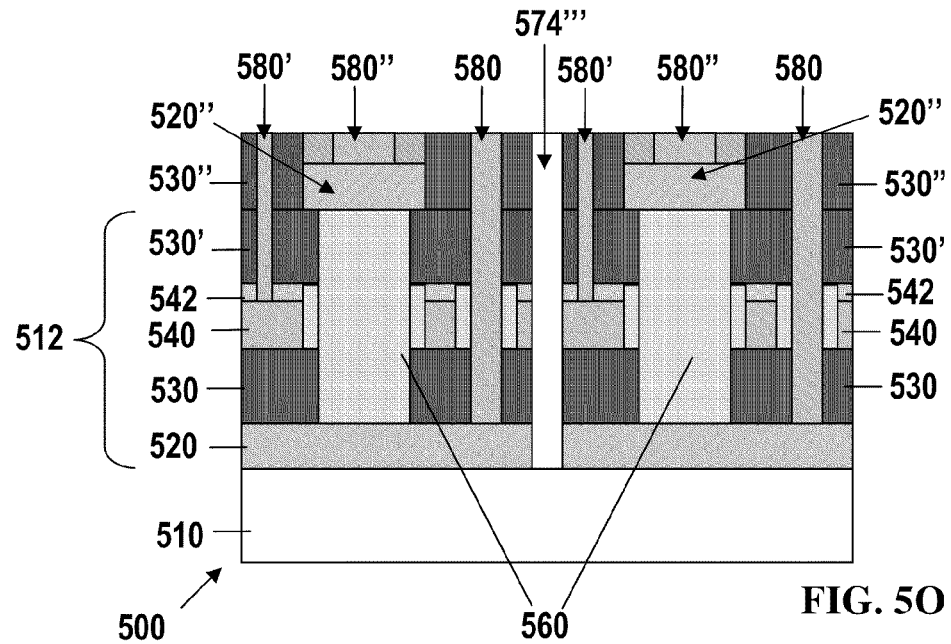
Figure 5P:
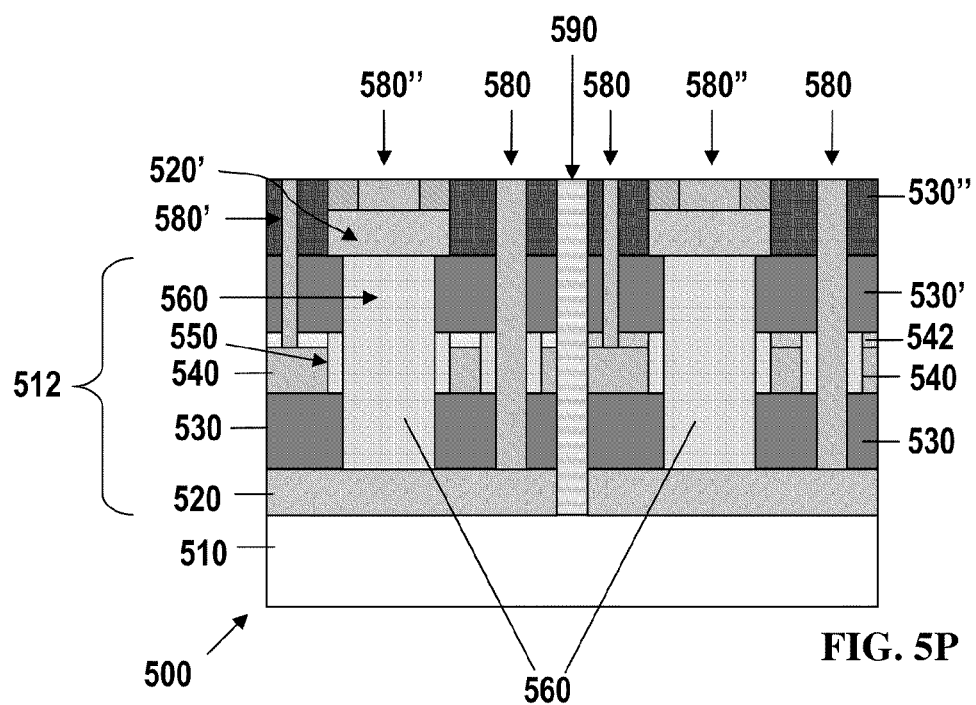

FIGS. 5A to 5P are schematic diagrams which show yet another alternative method of fabricating isolated vertical FET with electroplated nanowire as the device channel according to one embodiment of the present invention.

FIG. 5A shows a device structure 500 comprising two electroplated nanowire FETs 514 fabricated according to the method described in FIGS. 2A to 2H. The FETs 514 are built on an insulating substrate 510 in a stack 512 of layers including electrode layer 520, spacer layer 530, gate electrode layer 540 and capping layer 542 with an electrode layer 520' thereabove. The FETs 514 comprise two semiconductor nanowires 560 serving as the channels, with gate dielectric tubes 550, the common source/drain electrodes 520 and 520', and the common gate electrode 540 with optional capping layer 542. The gate electrode 540 and capping layer 542 are separated from the source/drain electrodes 520 and 520' by spacer layers 530 and 530'.

FIG. 5B shows the device 500 of FIG. 5A after a capping layer 522 was formed on top of the top source/drain electrode 520' to protect and electrically isolate the source/drain electrode 520'. This capping layer 522 can be composed of any material suitable for the spacer layer 230 as described in FIG. 2A, and can be formed by sputtering, evaporation, CVD, PVD and another deposition method. This capping layer 522 can be same as or different from, and preferably different from the spacer layer 530.

FIG. 5C shows the device 500 of FIG. 5B after a dry etch mask 570 with three openings 572 therethrough is formed on top of the capping layer 522. The etch mask 570 can be composed of any materials suitable for the mask 250 in FIG. 2B. The mask 570 is patterned by UV lithography, electron beam lithography or other similar methods. The etch mask 570 is a reverse via pattern and comprising pads aligned with the semiconductor nanowires 560. The diameter of the pads of the mask 570 can be equal or larger than the diameter of the semiconductor nanowire 560, but is preferably larger.

FIG. 5D shows the device 500 of FIG. 5C after RIE etching was used using the mask 570 to etch the capping layer 522 and the top source/drain electrode layer 520'. After the dry etching, the mask 570 was removed by chemical etch process, such as dissolving in a proper solvent. A pair of pads 522' are formed from the capping layer 522 and a pair of aligned pads 520" are formed from the source/drain electrode layer 520' below the pads 522' providing covering of the top surfaces of the semiconductor nanowires 560.

FIG. 5E shows the device 500 of FIG. 5D after a spacer layer 530" are formed in between the pads 522' and 520" on top of spacer layer 530'. This spacer layer 530" can be composed of any material suitable for the layer 230 as described in FIG. 2A. This spacer layer 530" can be same as (shown) or different from (not shown) the spacer layers 530 and 530'. This spacer layer 530" can be formed by sputtering, evaporation, PVD, CVD, ALD and other available deposition processes. The deposition time can be varied such that the top surface of the spacer layer 530" can be lower than (not shown), even with (shown) or higher than (not shown) the top surface of the capping pads 522'. After the deposition, the top surfaces of the spacer layer 530" and the capping pads 522' are preferably polish and planarized.

FIG. 5F shows the device 500 of FIG. 5E after a dry etch mask 570' with openings 572' is formed on top of the spacer layer 530". The etch mask 570' can be composed of any materials suitable for the mask 250 in FIG. 2B. The mask 570' is patterned by UV lithography, electron beam lithography or other similar methods. The etch mask 570' has precisely defined openings 572' that are located at the places where the bottom source/drain electrode 520 are to be contacted. Each FET device has at least one and preferably one opening.

FIG. 5G shows the device 500 of FIG. 5F after reactive ion etching is used with the mask 570' to etch the spacer layers 530" and 530', the gate layer 540 and the optional capping layer 542, and the spacer layer 530. The columnar pores such formed 574' pass down the stack 512 of layers and connect onto the bottom source/drain layer 520. After the dry etching, the mask 570, was removed by chemical etch process, such as dissolving in a proper solvent.

FIG. 5H shows the device 500 of FIG. 5G after ring-shaped continuous gate dielectric layers 550' are formed in pocketed regions or notches on the wall of the columnar pores 574' around the gate layer 540 between the upper spacer layer 530' and the lower spacer layer 530 located laterally between and in direct contact with the columnar, nanowires 560 and the gate electrode layers 540. The gate electrode layer 540 is also located vertically between and in direct contact with the upper spacer layer 530 and the lower spacer layer 530'. The gate dielectric layers 550' can be formed with the method of forming the gate dielectric layer 270 as described in the FIGS. 2D to 2F.

FIG. 5I shows the device 500 of FIG. 5H after an interconnect structure 580 is formed by filling the columnar pores 574' with conducting material. The interconnect 580 connects from the top of the spacer layer 530" to the bottom source/drain electrode 520. The material suitable for the interconnect structure 580 include but not limited to Cu, Ni, Co, W, and other metals and conductive layers. The interconnect structure 580 can be formed by electroplating, CVD and any other available deposition process. In one embodiment of the present invention, the structure 580 is formed by electroplating Cu using a method described in U.S. Pat. Nos. 6,946,716 and 6,709,562. In another embodiment of the present invention, the structure 580 is formed by electroplating Cu using the bottom source/drain electrode 520 to carry the electric current or potential, as described for the electroplating of the semiconductor nanowire 280 in FIG. 2G. After the formation of the interconnect structure 580, the top surface of 580 is polished and planarized with the top surface of the spacer layer 530".

FIG. 5J shows the device 500 of FIG. 5I after a dry etch mask 570" with openings 572" is formed on top of the spacer layer 530". The etch mask 570" can be composed of any materials suitable for the mask 250 in FIG. 2B. The mask 570" is patterned by UV lithography, electron beam lithography or other similar methods. The etch mask 570" has precisely defined openings 572" that are located at the places where the gate electrode 540 are to be contacted. Each FET device has at least one and preferably one opening.

FIG. 5K shows the device 500 of FIG. 5J after reactive ion etching is used with the mask 570" through the openings 572" to etch down through the spacer layers 530" and 530' and the optional capping layer 542 in the stack 512 of layers to form columnar pores 574". The columnar pores 574" provide openings down exposing the top surface of the gate layer 540. After the dry etching, the mask 570" was removed by chemical etch process, such as dissolving in a proper solvent.

FIG. 5L shows the device 500 of FIG. 5K after an interconnect structure 580' is formed by filling the columnar pores 574" with conducting material. The interconnect 580' connects from the top of the spacer layer 530" to the gate electrode 540. The material suitable for the interconnect structure 580' include but not limited to Cu, Ni, Co, W, and other metals and conductive layers. The interconnect structure 580' can be formed by electroplating, CVD and any other available deposition process. In one embodiment of the present invention, the structure 580' is formed by electroplating Cu using a method described in U.S. Pat. Nos. 6,946,716 and 6,709,562. After the formation of the interconnect structure 580', the top surface of 580' is polished and planarized with the top surface of the spacer layer 530".

FIG. 5M shows the device 500 of FIG. 5L after an interconnect structure 580" connecting to the top source/drain electrode pads 520" is formed through the dielectric pads 522'. The material and the formation method of the structure 580" are the same as the structure 580' as described in FIGS. 5J to 5L. After the formation of the interconnect structure 580", the top surface of 580" is polished and planarized with the top surface of the spacer layer 530" and the dielectric pads 522'.

FIG. 5N shows the device 500 of FIG. 5M after a dry etch mask 570''' with openings 572''' is formed on top of the spacer layer 530". The etch mask 570''' can be composed of any materials suitable for the mask 250 in FIG. 2B. The mask 570''' is patterned by UV lithography, electron beam lithography or other similar methods. The etch mask 570''' is a reverse via pattern and comprises pads, which are aligned with the FET devices. Each pad 570''' covers one and only one FET device, including the interconnect structures 580, 580' and 580".

FIG. 5O shows the device 500 of FIG. 5N after reactive ion etching is used with the mask 570''' to etch the spacer layers 530" and 530', the gate layer 540 and the optional capping layer 542, the spacer layer 530, and the bottom source/drain electrode layer 520. The etched structures 574''' pass down the stack of layers and reach the substrate 510. The reactive ion etching separates the individual FETs covered by each of the pads of the mask 570'''. After the dry etching, the mask 570''' is removed by chemical etch process, such as dissolving in a proper solvent.

FIG. 5P shows the device 500 of FIG. 5O after isolating structures 590 comprise dielectric materials which fill the etched structures 574". The material suitable for the isolating structures 590 can be composed of any dielectric or insulating materials including but not limited silicon oxide, silicon nitride, aluminum oxide, hafnium oxide, and the combinations of the above. The isolating structures 590 can be same as (shown) or different from (not shown) the spacer layers 530 or 530'. The isolating structure 590 can be formed by CVD, ALD and any other deposition processes available to fill the material.

The arrays of vertical FETs fabricated using the method shown in FIGS. 5A to 5P are separated from each other with the isolating structures 590. Each FET device of FIG. 5P has the plated, columnar, semiconductor nanowires 560 as the device channels, the source/drain electrode layers 520 and 520', the spacers 530 and 530', the gate electrodes 540, and the ring-shaped, gate dielectric tubes 550. Each FET device has the interconnect structures 580, 580', and 580" connecting to the bottom source/drain electrode, the gate electrode, and the top source/drain electrode. Further interconnecting vias and wires can be built on top of the structure shown in FIG. 5P to connect the individual FET devices to form functional logic units.

Fifth Embodiment

Figure 6A:
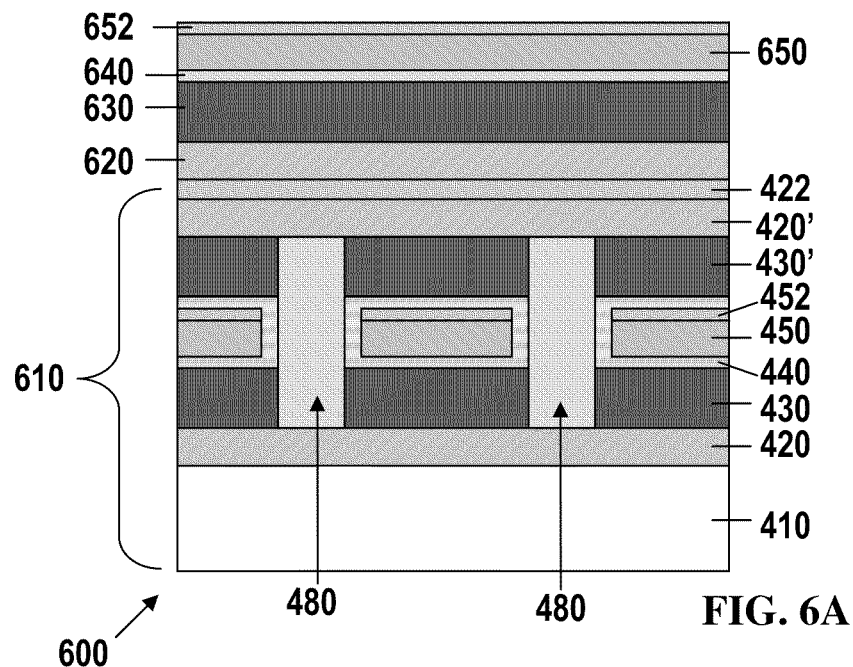
FIG. 6A to 6B are schematic diagrams of a method of fabricating three dimensionally integrated vertical FETs having electroplated semiconductor nanowires according to one embodiment of the present invention.
Figure 6B:
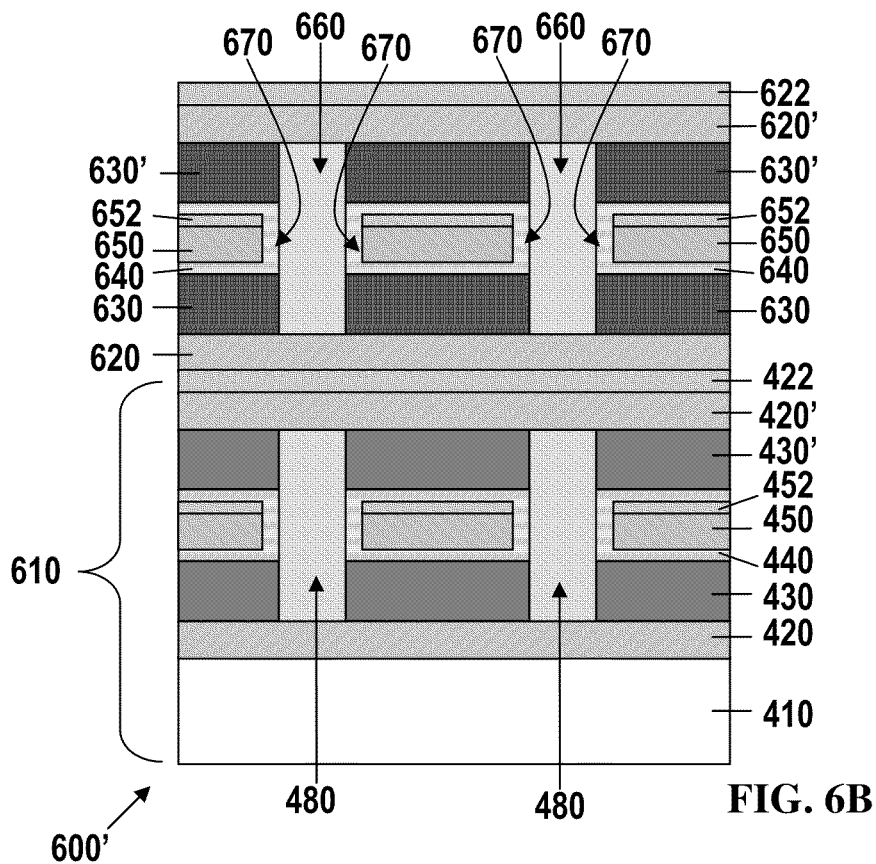

FIGS. 6A and 6B are schematic diagrams showing an example of a method of fabricating three-dimensionally integrated device comprising an embodiment of the present invention using the vertical FET with electroplated nanowire fabricated starting using the method described with reference of FIGS. 4A to 4J.

FIG. 6A shows a structure 600 consisting of a substrate 610 comprises a first level of FET devices, described above with reference to FIGS. 4A to 4J, and a stack of layers on the substrate 610. The stack of layers 610 is same as the stack of layers described in FIG. 4A etc. and it comprises a conductive layer 620, a spacer layer 630, an optional gate dielectric layer 640, and a gate electrode layer 650 with an optional capping layer 652. The structure 600 is the same as the structure 400 shown in FIG. 4A except for the substitution of the substrate 610 for the substrate 410 with the gate dielectric located between and in direct contact with the upper spacer layer 430' and the lower spacer layer 430 as shown and described above with reference to FIG. 4G.

FIG. 6B shows a device 600' similar to the device of FIG. 6A with a second level of vertical FETs built above the substrate 610 using the method described in FIGS. 4A to 4I with like elements being similarly identified. The structure 600' is the same as the structure 400 shown in FIG. 4A except for the substitution of the substrate 610. The device 600' comprises multiple levels of transistor devices. The stack of layers 610 is same as the stack of layers described in FIG. 4A etc. and it comprises a lower conductive layer 620, a lower spacer layer 630, an optional gate dielectric layer 640, gate dielectric tubes 670, a gate electrode layer 650 with an optional capping layer 652, an upper spacer layer 630', a conductive layer 620', and a capping layer 622. The substrate structure 600 is the same as the substrate structure 400 shown in FIG. 4A except for the substitution of the substrate 610 for the substrate 410. Above the stack of layers 610 are a conductive layer 620, a lower spacer layer 630, an optional gate dielectric layer 640, and a gate electrode layer 650, an upper spacer layer 630', and an upper conductor layer 620' with an optional capping layer 652. A pair of columnar, semiconductor nanowires 660 is formed extending up from the lower conductive layer 620 to the upper conductive layer 620' through the a lower spacer layer 630 and the upper spacer layer 630' with gate dielectric layer 640 isolating the gate conductors 650 from the nanowires 660 with the same kind of structure described above in like manner to analogous layers described above with reference to FIGS. 4A-4J. An optional capping layer 652 is formed on top of the gate electrodes 650 in like manner to capping layers 452 and gate electrodes 450 described above with reference to FIGS. 4A-4J. The substrate structure 600 is the same as the substrate structure 400 shown in FIG. 4A except for the substitution of the substrate 610. The gate dielectric tubes 670 are shown located vertically in notches or pockets between the upper spacer layer 630' and the lower spacer layer 630 as shown and described above with reference to previous embodiments. The gate dielectric tubes 670 are laterally juxtaposed and located between the gate electrodes 650 and the nanowires 660 and in direct contact therewith.

Alternatively, the multi-level of FET devices of FIGS. 6A and 6B can be further separated using the method described in FIGS. 5A to 5P. In another preferred embodiment of the present invention, the three dimensional integration method described in FIGS. 6A and 6B are performed after the FETs in the first level are separated and functional connected using the method described with reference to FIGS. 5A to 5P.

The term "comprising" (and its grammatical variations) as used herein is used in the inclusive sense of "having" or "including" and not in the exclusive sense of "consisting only of." The terms "a" and "the" as used herein are understood to encompass the plural as well as the singular.

All publications, patents and patent applications cited in this specification are herein incorporated by reference, and for any and all purposes, as if each individual publication, patent or patent application were specifically and individually indicated to be incorporated by reference. In the case of inconsistencies, the present disclosure will prevail.

The foregoing description illustrates and describes exemplary embodiments the present invention.

Additionally, while the disclosure shows and describes preferred embodiments of the present invention it is not intended to limit the scope of the invention to the embodiments described hereinabove which are intended to teach the best modes known of practicing the invention and to enable others skilled in the art to utilize the disclosure as such, or other embodiments and with the various modifications required by the particular applications or uses. While this invention is described in terms of the above specific exemplary embodiment(s), those skilled in the art will recognize that the invention encompasses changes or modifications within the scope of the invention and that the invention can be practiced with modifications within the spirit and scope of the appended claims. Also it is intended that the appended claims be construed to include alternative embodiments.

What is claimed as new and desired to be protected by Letters Patent of the United States is:

1. A Vertical Field Effect Transistor (VFET) device with a Vertical Semiconductor Nanowire (VSN) having therein an FET channel region between doped source and drain regions with said source and drain regions formed in distal ends of said VSN outside of said channel region, with said device comprising:
   a bottom conductive layer and an upper conductive layer;
   said VSN which is columnar formed in a stack of layers extending between said bottom conductive layer and said upper conductive layer;
   said stack of layers including said bottom conductive layer, a bottom spacer layer, the combination of a gate conductor at least partially surrounded by a gate electrode, an upper spacer layer, and said upper conductive layer;
   said bottom conductive layer, serving as a source/drain electrode layer formed on a substrate;
   said bottom spacer layer composed of a dielectric or insulating material formed on said bottom conductive layer having a top surface and surrounding a lower end of said VSN;
   a gate dielectric which is either ring-shaped or tube-shaped and is located in a recessed notch or pocket in said device surrounding and in direct contact with sidewalls of said VSN and in direct contact with a top surface of said bottom spacer layer and extending thereabove;
   said gate electrode surrounding and in direct contact with exterior sidewalls of said gate dielectric and extending thereabove;
   said upper spacer layer composed of a dielectric or insulating material formed above said gate electrode;
   said upper conductive layer serving as a second source/drain electrode layer formed on top of said upper spacer layer;
   said VSN extending through said stack of layers from said upper conductive layer to said bottom conductive layer;
   said VSN having a bottom end formed in electrical and mechanical contact with said bottom conductive layer and said VSN having a top end in electrical and mechanical contact with said upper conductive layer; and
   said VSN including said FET channel region located between said doped source region and said doped drain region formed at distal ends of said VSN with said bottom conductive layer and said upper conductive layer connected to a respective one of said source region and said drain region, wherein said gate dielectric formed between said bottom spacer layer and said gate electrode.

2. The VFET device of claim 1 including a capping layer formed on said gate electrode and below said upper spacer layer comprising a dielectric material.

3. The VFET device of claim 1 with a capping layer formed on said gate electrode and with said upper spacer layer formed thereon with said gate dielectric extending between said capping layer and said upper spacer layer and with said capping layer consisting of a material selected from the group consisting of silicon nitride, silicon oxide, aluminum oxide, and silicon oxynitride.

4. The VFET device of claim 1 wherein:
said bottom conductive layer is formed on top of said substrate and is composed of a material selected from the group consisting of nonconductive and highly resistive semiconductor materials;
said bottom spacer layer is in contact with a top surface of said bottom conductive layer;
said gate electrode is formed on an exterior surface of said gate dielectric above said bottom spacer layer; and
said gate dielectric surrounding said VSN above said bottom spacer layer and said upper spacer layer surrounding said gate dielectric above said gate electrode.

5. The VFET device of claim 4 with a capping layer on said gate electrode and said gate dielectric extending between said capping layer and said upper spacer layer.

6. The VFET device of claim 4 wherein said VSN comprises a plated wire.

7. The VFET device of claim 4 including electrical contacts to said source/drain electrode layer and to said gate electrode.

8. The VFET device of claim 4 including:
an array of VFET devices with each having a contact to a said gate electrode, a said bottom conductive layer and a said upper conductive layer;
arrays of VFET devices stacked on top of each other repeating another level of VFETs having plated VSNs on top of a previous level of VFETs.

9. The VFET device of claim 4 including:
a capping layer above said gate electrode; and
said gate dielectric extending between said capping layer and said upper spacer layer.

10. The VFET device of claim 1 including:
said VFET device including a plurality of VFETs;
contacts to the gate electrode and to the source/drain electrodes comprising pores across the stack of layers and interconnect via structures with said pores filled with conductors; and
isolating structures filled with dielectric material separating said VFETs.

11. The VFET device of claim 1 wherein said gate electrode is located proximate to a middle portion of said VSN between said bottom end and said top end and spaced away from said bottom conductive layer and said upper conductive layer.

12. The VFET device of claim 1 wherein said VSN is composed of a material selected from the group consisting of InSb, InAs, GaSb, CdS, CdSe, and CdTe.

13. The VFET device of claim 1 including:
said bottom conductive layer formed on said upper surface of a substrate;
said substrate having an upper surface which is composed of a material selected from the group consisting of nonconductive and highly resistive semiconductor materials;
said column-shaped pore extending through said upper spacer layer, through said gate electrode layer and through said bottom spacer layer in said stack of layers down to said top surface of said bottom conductive layer;
said VSN including said FET channel in a central region thereof between said doped source region and said doped drain region with said source and drain regions formed in opposite ends of said VSN, with said source electrode and said drain electrode connected to said source region and to said drain region respectively;
said gate dielectric formed on an exterior surface of said VSN above said bottom spacer layer separating said VSN from said gate electrode layer;
said upper conductive layer formed on top of said upper spacer layer in electrical and mechanical contact with said VSN; and
said gate electrode being separated from said bottom conductive layer by said bottom spacer layer and being separated from said upper conductive layer by said upper spacer layer.

14. The VFET device of claim 13 including:
a capping layer above said gate electrode; and
said gate dielectric extending between said capping layer and said upper dielectric spacer layer.

15. The VFET device of claim 14 including:
an array of VFET devices with each having a contact to a said gate electrode, said bottom conductive layer and said upper conductive layer; and
stacked arrays of VFET devices on top of each other comprising repeated VFET levels having plated VSNs on top of previous said VFET levels.

16. The VFET device of claim 13 wherein said gate electrode is located proximate to a middle portion of said VSN between said bottom end and said top end.

17. The VFET device of claim 13 wherein said VSN comprises a plated and planarized nanowire.

18. The VFET of claim 13 wherein said VSN is composed of a material selected from the group consisting of InSb, InAs, GaSb, CdS, CdSe, and CdTe.

19. The VFET device of claim 1 wherein said VSN comprises a plated and planarized nanowire.

20. The VFET device of claim 1 wherein said VSN is composed of a material selected from the group consisting of Ge, InSb, InAs, GaAs, GaSb, CdS, CdSe, CdTe, and other II-VI and III-IV compounds.

* * * * *